(12) United States Patent
Burns et al.

(10) Patent No.: US 6,542,859 B1
(45) Date of Patent: Apr. 1, 2003

(54) METHOD FOR DESIGNING A CYCLIC SYMMETRIC STRUCTURE

(75) Inventors: Donald W. Burns, Danville, IN (US); John R. Louie, Mooresville, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

(21) Appl. No.: 09/643,904

(22) Filed: Aug. 21, 2000

Related U.S. Application Data

(63) Continuation of application No. PCT/US00/12994, filed on May 12, 2000.
(60) Provisional application No. 60/133,956, filed on May 13, 1999.

(51) Int. Cl.$^7$ .................................................. G06F 7/48
(52) U.S. Cl. ..................... 703/7; 703/1; 703/2; 703/8; 703/18; 416/190; 416/241
(58) Field of Search .................................. 700/301, 287; 703/18, 7, 8, 2, 1; 416/190

(56) References Cited

U.S. PATENT DOCUMENTS

| | | |
|---|---|---|
| 3,078,737 A | 2/1963 | McGavern |
| 3,257,854 A | 6/1966 | Schneider et al. |
| 3,479,906 A | 11/1969 | Valus |
| 3,986,792 A | 10/1976 | Warner |
| 4,126,066 A | 11/1978 | Wagor et al. |
| 4,192,633 A | 3/1980 | Herzner |
| 4,422,333 A | 12/1983 | Leon |
| 4,453,891 A | 6/1984 | Forestier |
| 4,457,668 A | 7/1984 | Hallinger |
| 4,460,314 A | 7/1984 | Fuller |
| 4,516,910 A | 5/1985 | Bouiller et al. |
| 4,523,666 A | 6/1985 | Murray |
| 4,663,983 A | 5/1987 | Kobayashi et al. |
| 4,887,468 A | 12/1989 | McKendree et al. |
| 4,962,677 A | 10/1990 | Withers |
| 4,996,880 A | 3/1991 | Leon et al. |

(List continued on next page.)

OTHER PUBLICATIONS

"Modelling of the Long term dynamic Performance of a Gas Turbo Generator Set", H.J. Nern, IEEE 0–7803–1872–2/94.*
"GE Gas Turbine Design Philospohy" D.E. Brant, 9/94 GER–3434D, GE Industrial Power Systems.*
*Journal of Sound and Vibration*; vol. 181; Issue 5; pp. 851–871, Apr. 6, 1995.
*Journal of Sound and Vibration*; vol. 195; Issue 6; pp. 649–666, Aug. 29, 1996.
*Vibration Analysis of the Stator in Ultrasonic Motor*; vol. 2; pp. 1091–1094, May 25–30, 1997.
*Vibration Behavior of Switched Reluctance Motors by Simulation and Experimental Procedures*; pp. 3158–3161, Nov. 306, 1997.

*Primary Examiner*—Hugh Jones
*Assistant Examiner*—Fred O Ferris, III
(74) *Attorney, Agent, or Firm*—Woodard, Emhardt, Naughton, Moriarty & McNett LLP

(57) ABSTRACT

A method for analyzing and designing structures with structural aliasing. The concept of structural aliasing applies in one embodiment of the present invention to structural systems which are cyclically symmetric. In analyzing and designing structural systems such as wheel assemblies of gas turbine engines, it is possible to group the discrete components so as to aliasingly couple particular ordered excitations and harmonic families. With structural aliasing, it is possible to couple the ordered excitations and harmonic families such that resonant response of the wheel assembly does not occur within the operating range of the engine, and also to have the resonant vibratory mode excited in such a manner that the drive coupling of the wheel dampens the wheel assembly.

34 Claims, 14 Drawing Sheets

U.S. PATENT DOCUMENTS

| | | |
|---|---|---|
| 5,211,540 A | 5/1993 | Evans |
| 5,291,975 A | 3/1994 | Johnson et al. |
| 5,365,787 A | 11/1994 | Hernandez et al. |
| 5,369,348 A | 11/1994 | Gennesseaux |
| 5,415,063 A | 5/1995 | Hönlinger et al. |
| 5,471,880 A | 12/1995 | Lang et al. |
| 5,474,421 A | 12/1995 | Rossmann |
| 5,490,759 A | 2/1996 | Hoffman |
| 5,511,948 A | 4/1996 | Suzuki et al. |
| 5,522,705 A | 6/1996 | Elaini et al. |
| 5,540,551 A * | 7/1996 | Heinig ............ 416/190 |
| 5,560,267 A | 10/1996 | Todd et al. |
| 5,582,077 A | 12/1996 | Agram et al. |
| 5,599,165 A | 2/1997 | Elaini et al. |
| 5,673,598 A | 10/1997 | Duclos |
| 5,686,669 A | 11/1997 | Hernandez et al. |
| 5,988,982 A * | 11/1999 | Clauer ............ 416/241 |
| 6,090,147 A * | 7/2000 | Bremner et al. ............ 703/1 |
| 6,199,026 B1 * | 3/2001 | Shiraishi et al. ............ 702/140 |
| 6,223,524 B1 * | 5/2001 | Durcan ............ 60/226.1 |
| 6,299,410 B1 * | 10/2001 | Hilbert et al. ............ 416/145 |

* cited by examiner

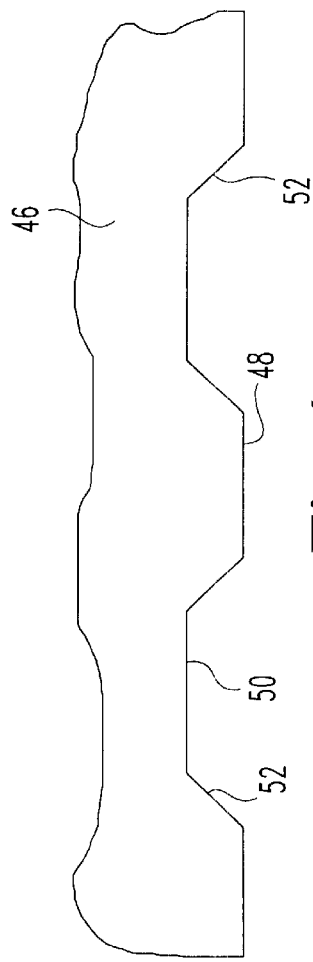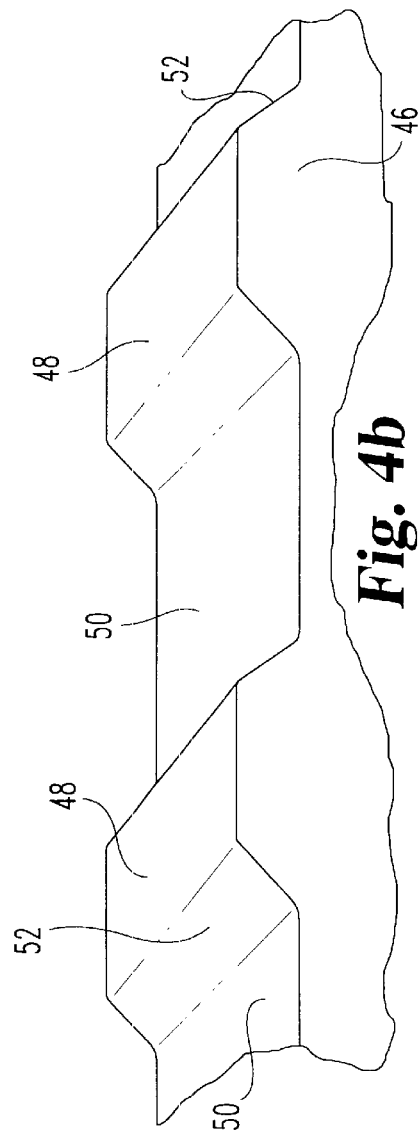
Fig. 4a (PRIOR ART)
Fig. 4b (PRIOR ART)

METHOD FOR DESIGNING A CYCLIC SYMMETRIC STRUCTURE

The present application is a continuation of PCT/US00/12994 filed May 12, 2000. The PCT Application PCT/US00/12994 claims the benefit of U.S. Provisional Patent Application Serial No. 60/133,956 filed May 13, 1999. The Provisional and PCT applications are incorporated herein by reference.

BACKGROUND OF THE INVENTION

The present invention relates to methods for analyzing and/or designing structural systems with damping. More particularly in one form, the present invention relates to methods for analyzing and designing wheels and other cyclic symmetric structures of gas turbine engines such that there is damping of one or more vibratory responses of the wheel assembly, or such that a particular excitation is no longer aliasingly coupled into one or more vibratory modal responses. Although the present invention was developed for analyzing gas turbine engine components, it has application to analyzing cyclic symmetric structures in other fields of technology.

The deleterious effects of forced resonant vibration are well known. Structures often show lightly damped vibratory response at their resonant frequencies. When the resonant response is forced by an excitation at the same frequency, the structure is often subjected to high cycle fatigue (HCF) stresses in excess of the HCF stress limit of the material of the structure, with subsequent breakage.

In a gas turbine engine, structures such as wheels of the turbine and compressor section are sometimes analyzed so as to better understand their dynamic response. Further, wheel assemblies and other gas turbine engine structures are sometimes exposed to substantial amounts of testing as components, subassemblies and complete engines. During this analysis and testing, it may be that the resonant frequencies of the wheel assembly respond not just to the frequency of the excitation, but also the manner in which the excitation couples into the mode shape of the wheel assembly. For example, a particular vibratory mode shape may respond strongly with greatly amplified motion at its resonant frequency when excited at that frequency by a specific multiple of the engine rotational speed. However, that same vibratory mode shape may show greatly reduced response when excited at the same frequency by a different multiple of engine operation. In addition, that same vibratory mode may show greatly reduced response if excited at the same frequency and multiple of engine operation and the mode is no longer aliasingly coupled to the multiple of engine operation.

When a lightly damped, highly amplified response exists within the speed range of the engine, it is sometimes necessary to take corrective action to prevent breakage of the wheel assembly. This corrective action could include stiffening of the wheel assembly so that the resonant frequency of the vibratory mode of interest is raised outside of the engine operating range. Unfortunately, a wheel redesigned to be stiffer may also be heavier. In other situations, it may be necessary to alter the components in the flow path upstream of the wheel assembly. However, this alteration may be expensive.

What is needed then, is a method of analyzing and designing wheel assemblies and other components to alter their vibrational characteristics with minimal impact on weight and cost. The present invention accomplishes this and other needs in a novel and unobvious way.

SUMMARY OF THE INVENTION

Briefly describing one aspect of the present invention, there is a cyclically symmetric structure that is associated with a rotating device, and wherein an integral multiple of the rotational speed of the rotating device resonates a first natural frequency of the cyclically symmetric structure. Periodic discontinuities may be introduced into the structure such that the integral multiple of rotational speed can be made to aliasingly couple into a second natural frequency, and no longer couple, or minimally couple, into the first natural frequency.

Briefly describing another aspect of the present invention, there is a contemplated method for analyzing and/or designing a cyclically symmetric structure that includes preparing a finite element model of the cyclically symmetric structure which includes a model of a frictional interface. A frictional interface stress or deflection is predicted for the vibratory response of the model with the structure arranged in a first asymmetry. After rearranging the structure in a second asymmetry, the frictional interface stress or deflection is recomputed. The frictional interface stress or deflection from the first asymmetry is compared with the frictional interface stress or deflection of the second asymmetry, and the structural arrangement having the asymmetry with the higher stress or deflection is selected.

Briefly describing one aspect of the present invention, there is a gas turbine engine with a wheel assembly, wherein an integral multiple of the rotational speed of the engine resonates a first natural frequency of a wheel assembly, the wheel assembly comprising a wheel and a plurality of blades. The blades may be grouped such that the integral multiple of rotational speed no longer resonates the first natural frequency. By grouping the blades, the integral multiple of rotational speed can be made to aliasingly couple into a second natural frequency, and no longer couple, or only weakly couple, into the first natural frequency.

Briefly describing another aspect of the present invention, there is a method for designing a gas turbine engine that includes preparing a finite element model of a wheel assembly which includes a model of a coupling. A coupling stress is predicted for the vibratory response of the model with the blades of the wheel assembly grouped in a first pattern. After regrouping the blades in a second pattern, the coupling stress is recomputed. The coupling stresses from the first pattern are compared to the coupling stresses from the second pattern, and the pattern with the higher stress is selected.

These and other aspects of the present invention will be apparent from the drawings, description of the preferred embodiment, and the claims to follow.

DESCRIPTION OF THE DRAWINGS

FIG. 4a is a view of a portion of the drive coupling of FIG. 3 as viewed from point 4a of FIG. 3.

FIG. 4b is a perspective view of the drive coupling of FIG. 4a.

DESCRIPTION OF THE PREFERRED EMBODIMENT

Figure 1:
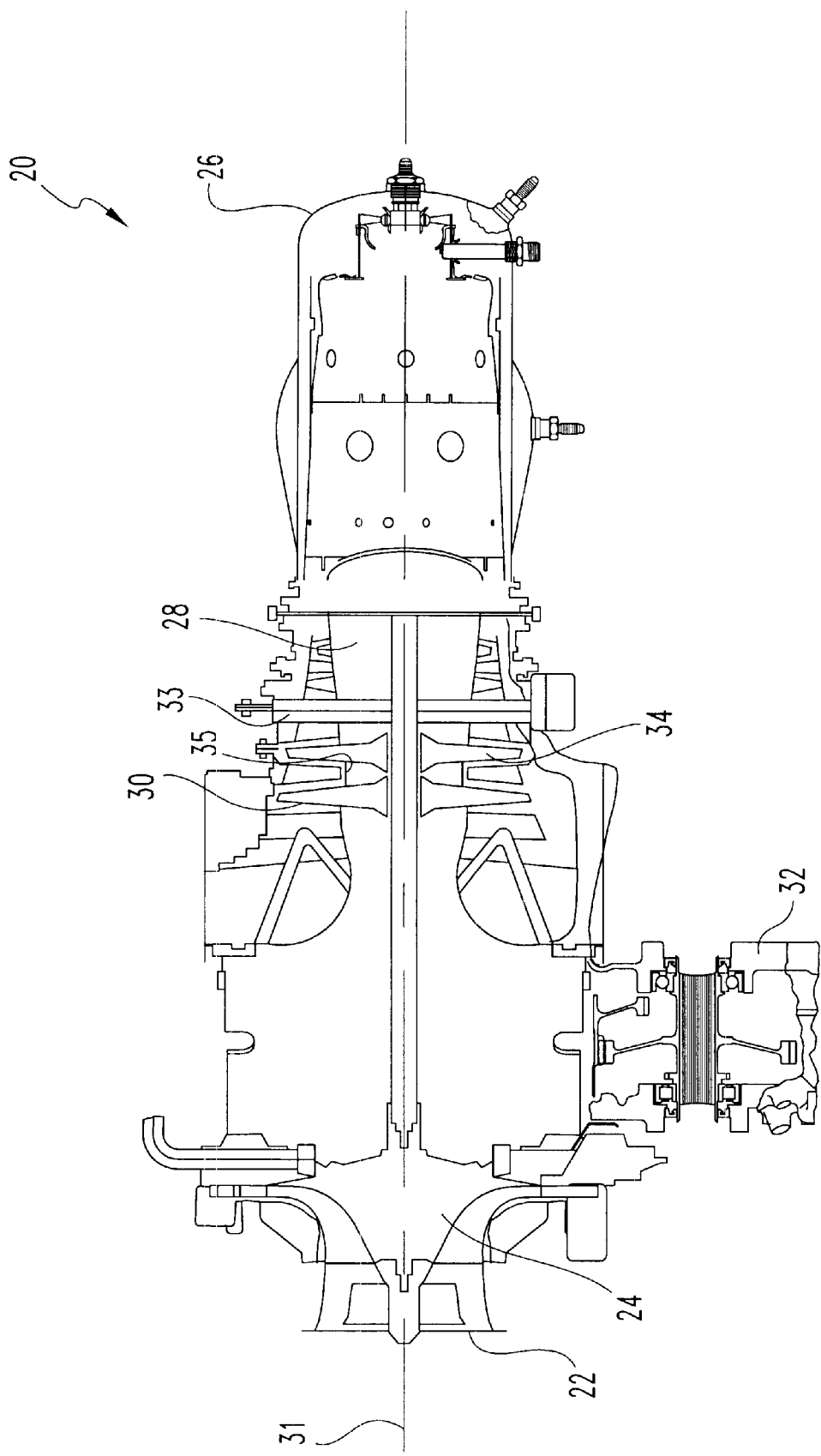
FIG. 1 is a cut-away side schematic representation of a gas turbine engine according to one embodiment of the present invention.

For the purposes of promoting an understanding of the principles of the inventions, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

The present invention relates generally to methods for analyzing and/or designing cyclic symmetric structures with damping. The techniques, methods and systems of the present invention are applicable to a wide variety of cyclic symmetric components such as but not limited to gears, disks, circular seals, rings, wheels, bladed disks, nozzles, disk brakes, magnetic disks, computer storage devices, electric motors and pumps. These techniques, methods and systems of the present invention will generally be described with reference to gas turbine engine wheel assemblies. However, there is no limitation intended herein to limit the application of the present invention to gas turbine engine wheel assemblies and/or gas turbine engine components and application to a variety of components in other fields of technology is contemplated herein. More specifically, the techniques, methods and systems of the present invention are applicable to analyzing and/or designing cyclic symmetric structures.

The following terms used herein are defined as follows:

Wheel assembly: an assembly of a wheel with a plurality of discrete components arranged on it. As one example, the wheel assembly can be from either a compressor section or turbine section of a gas turbine engine, and includes a plurality of blades on the periphery of the wheel. As another example, the wheel assembly is a single piece casting including a wheel, blades, and a shroud connecting the outermost edges of the blades.

Operating speed range: the range of engine rotational speeds from idle to maximum overspeed.

Engine order (EO): a range of frequencies which correspond to a multiple of engine rotational speed. For example, fifth engine order (5EO) corresponds to a range of frequencies from five times idle speed (converted to frequency), to five times maximum overspeed (converted to frequency).

Node or Nodal Line: for a particular vibratory modal response, an area of the structure having little, if any, displacement when the structure is vibrating in that modal shape.

Juncture node: a point that is part of a modeling element in a finite element modeling program, especially at a corner of the modeling element. For example, a triangular plate element includes three juncture nodes, one at each of the vertices of the triangle.

Finite element model: a model of a structure comprised of a plurality of simplified, individual modeling elements linked together in the shape of the structure. The finite element models shown herein represent complete models for various wheel assemblies, even though only a portion of the wheel assembly is depicted. However, by imposing the proper boundary conditions on the end faces of the models, the sectional models shown herein respond as models of the complete structure.

Axisymmetric Structure: a structure that can be obtained by rotating a two dimensional structure 360 degrees about an axis. An example is a disk without blades, slots, or holes.

Cyclically Symmetric Structure: A structure which can be represented by rotating some segment of the structure a discrete number (N) times through an angle of 360/N degrees about some axis. A bladed disk in an example.

Harmonic Family: A family of vibratory modal responses, or modal shapes, in which a set of corresponding points on a sector of a cyclically symmetric structure is related by a sinusoidal pattern with a certain number of cycles. If the number of sectors in the cyclically symmetric structure is N, natural modes belong to a harmonic family with k cycles where:

$$0+k+N/2 \text{ if N is even, and } 0+k+(N-1)/2 \text{ if N is odd.}$$

Vibratory responses can be represented as a superposition of such harmonic patterns, such as by a discrete Fourier series.

The harmonic patterns of a cyclically symmetric structure are sometimes referred as diametral patterns. This terminology applies to continuous harmonic patterns, especially when the structure is axisymmetric. When the structure includes asymmetry, the modes can be broken down into a finite set of harmonic families in which corresponding points are harmonically related. It is possible to view each harmonic family as a coupled set of diametral patterns. For example, harmonic family zero may be viewed as the coupling of diametral patterns 0, N, 2N, in a repeating series. Similarly, harmonic family one may be viewed as the coupling of diametral patters 1, N-1, N+1, 2N-1, 2N+1 in a repeating series. Similar series may be written for other harmonic families. The diametral node lines of a cyclically symmetric structure may have complex shapes with different numbers of node lines observed at different locations. For example, a harmonic family one mode may exhibit one diametral node line near the center of a disk, but N+1 node lines near the blades.

Excitation Order: The forcing function represents a periodic function in time which can be broken down into a continuous Fourier series in time representing harmonics referred to as the excitation order. For the example of blades rotating past the wake of a stationary vane, the forcing function can be considered as a traveling wave relative to the blades, with the excitation order representing the spatial harmonic index of a continuous spatial Fourier decomposition of the forcing function.

Although the force is continuous in this example, it is sampled by the blades at discrete locations. For example, if the harmonic number of the force distribution harmonic index is a multiple of N (where N is the number of blades) the blades are excited by about the same forces at about the same time and hence 'see' the force as belonging to harmonic family zero. If the force distribution harmonic number index is a multiple of N plus or minus 1, the blades will 'see' the force as belonging to harmonic family 1. This phenomenon is included in the concept of aliasing. In general, the discrete harmonic families will be excited by the following engine orders:

| Harmonic family | | Engine Orders | |
|---|---|---|---|
| 0 | 0 | N | 2*N |
| 1 | 1 | N − 1, N + 1 | 2*N − 1, 2*N + 1 |
| 2 | 2 | N − 2, N + 2 | 2*N − 2, 2*N + 2 |

Note that these relationships are as described for the relationship between cyclically symmetric harmonic patterns and diametral patterns. Both can be derived from the relationship of discrete and continuous Fourier series.

The above relationships show which engine orders excite which harmonic families. Each engine order excites a harmonic family and is orthogonal to other harmonic families. This orthogonality arises from the trigonometric identity:

$$\Sigma[\cos(2\ pi\ j\ k/N)\cos(2\ pi\ j\ m/N)]=0, \text{ for } j=0, N-1$$

when $k \pm m$ is not a multiple of $N$.

In the above expression "j" is a summation over blades (or sectors), "k" represents the harmonic number of the blade harmonic family, and "m" represents the forcing function engine order. The trigonometric identity relates that little or no energy results from the product of harmonic forces and displacements except for certain special relationships between the sector family and forcing function harmonic indices.

For example, if there are 30 blades and 37 vanes, then the harmonic families range from 0 to 15, and the excitation engine orders are 37, 74, 111, in a repeating series. As examples, engine order 37 excites modes in harmonic family 7 (37=30+7); engine order 74 excites modes in harmonic family 14 (74=2*30+14); engine order 111 excites modes in harmonic family 9 (111=4*30−9).

Vibratory modal response: a vibratory response in which a particular vibratory mode shape assumed by the structure resonates at a particular natural (or resonant) frequency. These mode shapes are designated with a second number. For example, the first three modes (three lowest frequencies) of the 0D modal family would be 0D1, 0D2, and 0D3.

Resonant response: A response wherein a particular natural frequency is excited at that frequency, and the structure responds with motion that is greater than the motion of the excitation alone. This motion is also referred to as amplified motion.

Structural Order: The number of discrete components associated with a structural component. As examples: a vane stage in a gas turbine engine with 31 vanes has an order of 31; an array of 5 struts that hold one gas turbine component relative to another gas turbine component has an order of 5; and a rotating impeller of a pump with 7 channels has an order of 7. By further example, the order of the impeller is higher than the order of the struts. The structural order may be considered equivalent to an engine or excitation order (EO). The term "EO" refers to an excitation order, engine order, or structural order unless otherwise specified.

Specific order harmonic families can be excited by the same specific order of rotational speed or the same specific order of geometry. For example, a fifth order (5D) harmonic family of a wheel assembly in a gas turbine engine can be excited by five struts located upstream of the wheel assembly. This is because the five struts create five regions of aerodynamic disturbances in the flow path of the gas turbine engine. As the wheel assembly rotates within the gas path, any particular portion of the wheel assembly in the flow path is excited five times aerodynamically as the wheel assembly completes one revolution. Therefore, the five struts create a fifth engine order (5EO) excitation that excites the 5D harmonic family. In order to avoid structural damage from a 5EO excitation that resonates a particular vibratory modal response of the 5D harmonic family, it is helpful, as an example, to stiffen the wheel such that the specific resonant frequency associated with the specific vibratory mode is not encountered within the operating speed range of the engine.

It is not well known that specific lower order harmonic families can be excited by higher order structural geometries, where the higher order structural geometries are different. For example, a stage of 31 vanes for altering the velocity and/or angle of the engine air upstream of a wheel assembly with 35 blades can excite the 4D harmonic family of the wheel assembly. As another example, 25 vanes upstream of a 35 blade turbine wheel assembly can excite the 10D harmonic family of the wheel assembly. The present invention includes an understanding of why different higher order geometries can induce a lower order response, and methods for analyzing and designing wheels to take this phenomenon into account.

This phenomenon is referred to herein as structural aliasing, or aliasing. Structural aliasing involves a structurally ordered geometry that, if excited by an ordered excitation, resonantly responds to that excitation in a harmonic family according to a well-defined mathematical relationship. In certain cases, structural aliasing involves the excitation of a higher structurally ordered geometry by a lower ordered excitation, such as from a lower structurally ordered geometry, with resonant response of the higher structurally ordered geometry to that excitation in a still lower harmonic family. As stated above, a wheel assembly with 35 blades, when excited by aerodynamic disturbances from 31 vanes upstream of the blades, resonantly responds in a vibratory modal response from the 4D harmonic family. During one complete revolution of the wheel assembly, the wheel assembly is exposed to an alternating load pattern of 31 cycles. After placing 35 evenly-spaced points along the 31-cycle excitation, representative of the 35 evenly-spaced turbine blades, another lower order pattern of 4 cycles can be superimposed on top the pattern of 31 cycles such that the 4-cycle pattern and 31-cycle pattern intersect at the 35 evenly spaced points. Thus, exciting the 35 turbine blades 31 (31EO) times per revolution results in a 4D response of the wheel assembly.

Structural aliasing occurs in a wheel assembly as the wheel assembly deviates from being axisymmetric. In an axisymmetric system, the various harmonic families contain substantially diametrically patterned modes. However, as deviations or discontinuities such as, for example, holes, slots, air foils, or gear teeth are introduced to the axisymmetric system, the modes within a harmonic family become composed of linear combinations of several diametral harmonic families. The resultant combined modes may be nearly pure, or recognizable but distorted, or have no recognizable harmonic content. However, any vibratory excitation having an order that corresponds to any one of the separate harmonic families subsumed within the larger aliased family can excite vibratory responses within any one of the separate harmonic families. As pointed out in the last example, a 31EO excitation of a 35 turbine blade wheel assembly will result in a response from the 4D harmonic family. Similarly, a 4EO input to the wheel assembly will result in a response from the 31D harmonic family.

Tables 1, 2 and 3 each show how various engine orders and harmonic families (both represented within any specific row of the Tables) aliasingly interact, according to the sums and differences described above. The variable "G" refers to the number of groupings of discrete components. For example, Table 1, harmonic family 4, shows that a wheel assembly with 35 turbine blades produces response in the 4D harmonic family when excited by 31 turbine vanes. As can be seen by other entries in that same horizontal row, upstream vane stages of either 39, 66 or 74 vanes can likewise induce response in the 4D harmonic family. Note that the rows for Tables 1, 2, and 3 are truncated for n=2. Mathematically, these tables and relationships continue, since n is unbounded.

Table 2 represents a structural aliasing table for a structure with seven (7) discrete groups. In one embodiment of the present invention, each of the seven (7) groups includes five (5) blades connected by a shroud section. Table 2 shows how various harmonic families and excitations (as represented within a row) couple together as a result of structural aliasing. For example, the 2D harmonic family of Table 2 can be excited by 2EO, 5EO, 9EO, 12EO, and 16EO excitations. Note that within a row, there is no difference between excitations and harmonic families. For example, in that same row of Table 2, the 5D harmonic family can be excited by 2EO, 5 EO, 9EO, 12EO and 16EO excitations.

Table 3 represents a structure with five (5) discrete groupings. In one embodiment of the present invention, this table represents a pattern of structural aliasing for a shrouded wheel assembly wherein the shroud is slotted such that five (5) discrete groupings of blades are formed. As can be seen in the row represented by the 2D harmonic family, structural aliasing is shown to exist among the 2D, 3D, 7D, 8D, 12D, 2EO, 3EO, 7EO, 8EO, and 12EO harmonic families and excitations. As a result of structural aliasing, for example, an 8EO excitation can induce response in the 12D harmonic family.

Figure 8:
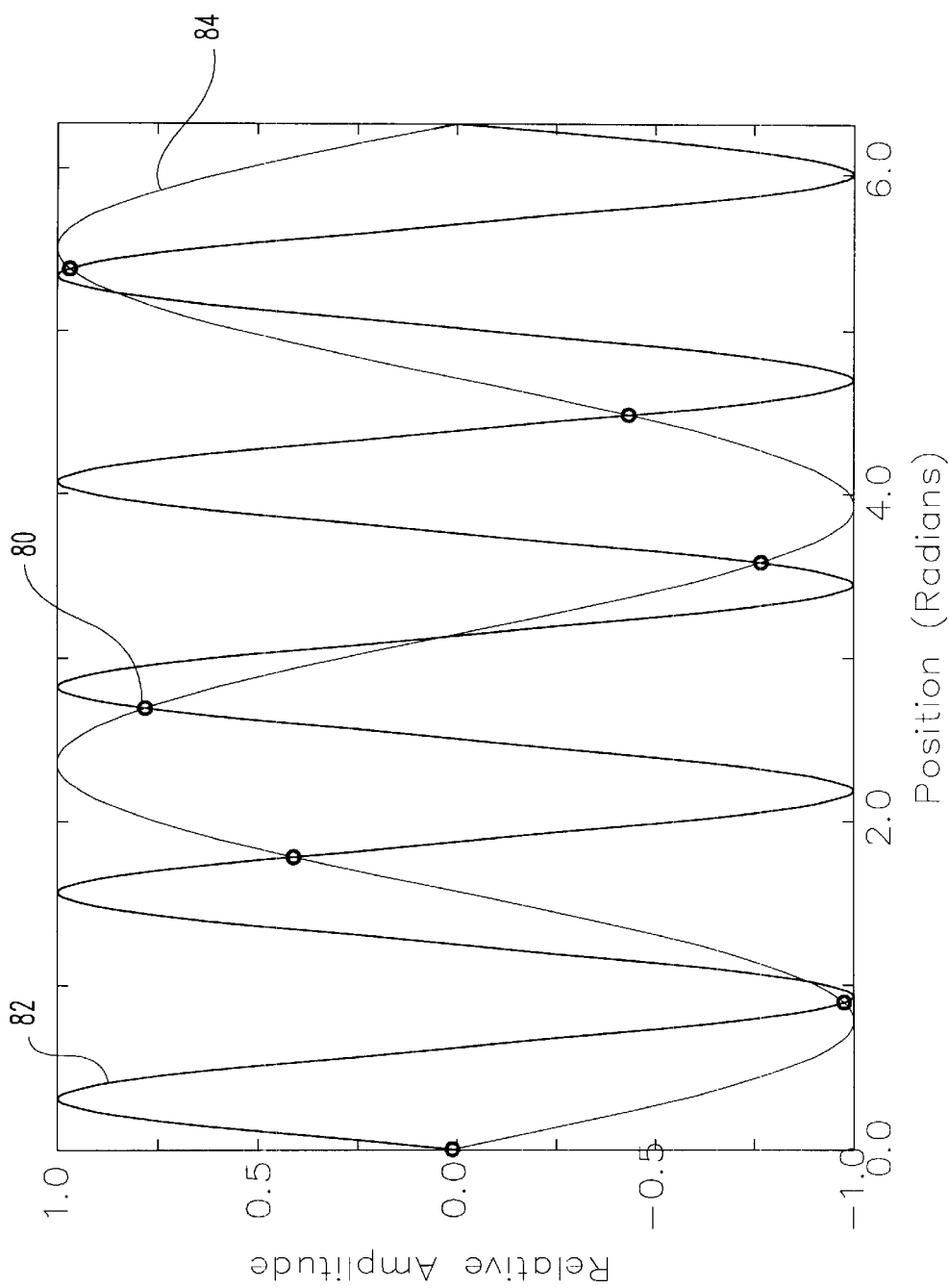
FIG. 8 is a graphical representation of structural aliasing.

The diagram of FIG. 8 graphically illustrates structural aliasing. In this example, one complete revolution of a wheel assembly is represented as a position in radians between 0 and $2\pi$. The groupings of a wheel assembly with seven (7) equally-spaced groupings of blades are represented by seven (7) equally spaced points 80. A 5EO excitation 82, shown as a five-cycle sinusoid, provides five (5) alternating inputs to the wheel assembly as it completes each $2\pi$ of revolution. As points 80 are drawn on excitation curve 82, it can be seen that a second excitation wave 84 of a lower frequency (in this example, 2EO) can be superimposed on excitation 82, such that both excitation waves 82 and 84 go through each of the seven (7) equally spaced points 80. Thus, the wheel assembly with seven (7) groupings, when excited by a 5EO excitation, can respond in both the 2D and 5D harmonic families. Similarly, when the structure is excited by 2EO excitation, the structure can respond in both 2D and 5D harmonic families. Analogously, when analyzing the vibratory modal responses of the wheel assembly in a finite element model, some finite element program solution algorithms cannot distinguish the 2D harmonic family from the 5D harmonic family.

One embodiment of this invention concerns the use of aliasing to analyze and design wheel assemblies so that particular engine orders do not excite certain harmonic families. In another embodiment of the present invention, aliasing is used to excite one or more harmonic families of a wheel assembly which, by the form of one or more modes shape or by other ways, respond in a damped manner. In yet another embodiment, the present invention concerns analysis of wheel assemblies for gas turbine engines, where the blades are shrouded and arranged in groupings such as by slotting the shroud, such that the vibration of a particular vibratory mode shape causes friction against or within the wheel assembly. In a preferred embodiment, the wheel assembly is a cast assembly of a wheel with shrouded blades, where the blades are arranged in groupings by slotting of the shroud, and the cast wheel assembly is coupled to other rotating structure within the gas turbine engine by a curvic coupling. In the wheel assemblies with shrouded blades it is contemplated herein that the slotting/discontinuities can be entirely in the shroud, or entirely in the wheel, or a combination with some slots/discontinuities in the shroud and some in the wheel. In one form of the present invention absence of material as in a slot and/or the presence of additional material to create a localized positive region can achieve the formation of discontinuities. It is believed that by proper slotting of the shroud, a particular engine order sufficiently excites the one or more vibratory modal responses of the aliased harmonic family to induce sliding friction at the curvic coupling to dampen the vibratory motion.

FIG. 1 is a cross-sectional schematic representation of the gas turbine engine 20, such as an Allison Model 250 engine. Engine 20 includes an inlet 22 for providing air to a compressor 24. The compressed air is provided to a combustor 26 where it is mixed with fuel and burned. The combusted mixture flows through a gasifier turbine 28, and then a power turbine 30 before exiting as exhaust gas. Gas exiting gasifier turbine 28 passes through an assembly 33 which includes five struts before entering power turbine 30. These struts support one non-,rotating component of the engine relative to another non-rotating component of the engine, and pass from one component to the other component through the engine gaspath. Power turbine 30 includes a third stage turbine wheel assembly 34. A gearbox 32 provides a location for power take-off from power turbine 30, or a location from which accessories are driven. Gasifier turbine 28, power turbine 30 and compressor 24 all rotate about centerline 31. A rotating spacer 35 is coupled to both third stage turbine wheel 34 and the fourth stage turbine wheel adjacent to wheel assembly 34.

Figure 2:
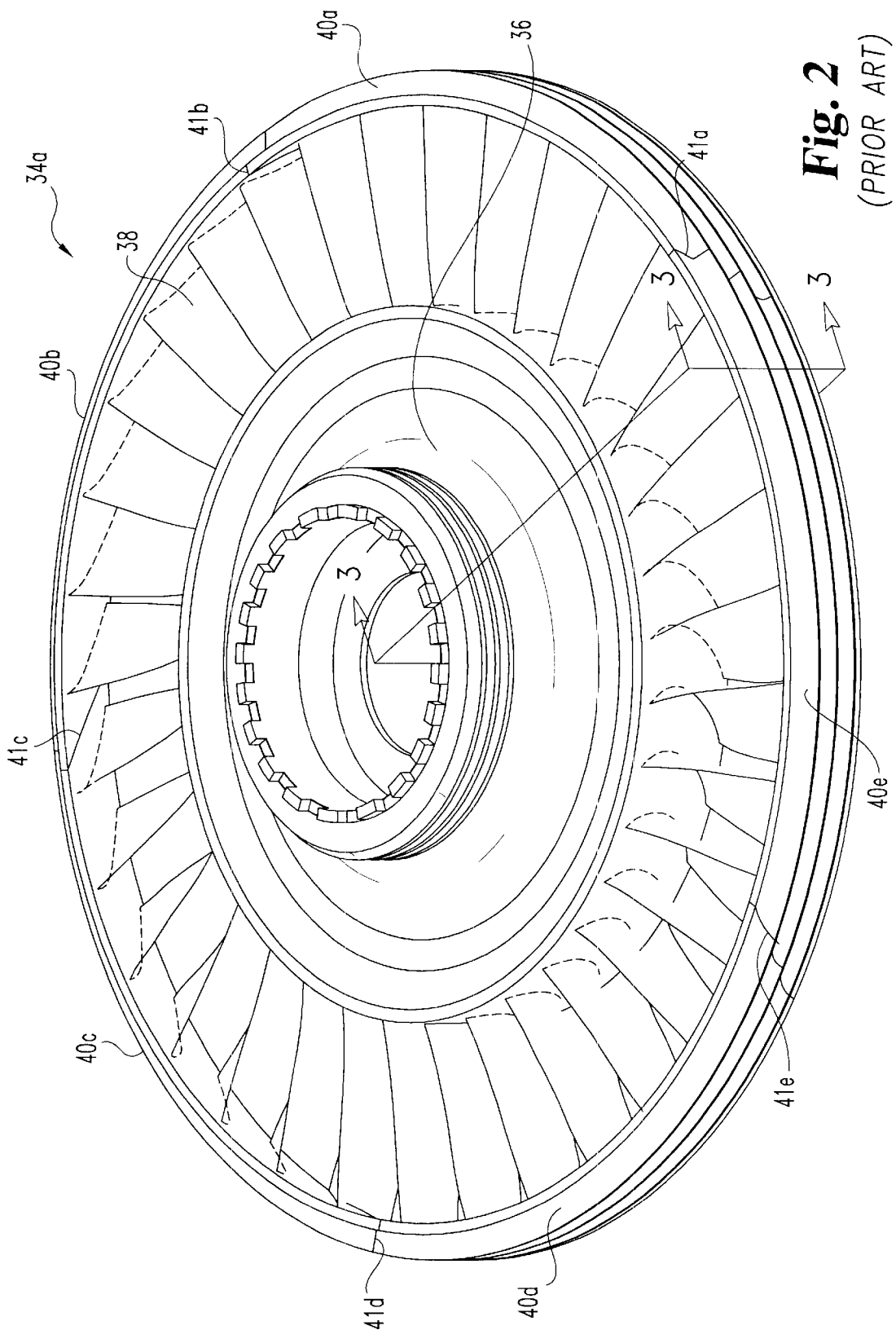
FIG. 2 is a perspective view of a wheel assembly according to one embodiment of the present invention.

FIG. 2 is a perspective view of the third stage turbine wheel assembly 34 of engine 20. In a preferred embodiment, wheel assembly 34 is a single piece casting including a central wheel section 36 surrounded by a plurality of integrally cast blades 38. A single piece, cast blade shroud 40 integral with blades 38 surrounds blades 38 and couples to their blade tips. Wheel 36 and blades 38 may be cast integrally or fabricated separately and coupled together. Wheel assembly 34 may be cast from any of those castable, heat-resistant alloys commonly used in gas turbine engines. In another embodiment of the present invention wheel assembly 34 is fabricated from composite materials, forged, or fabricated from other wheel fabrication methods or materials known to those of ordinary skill in the art.

As seen best in FIG. 2, wheel assembly 34 may be constructed in a variety of configurations differing in the manner in which shroud 40 is slotted. As discussed above, the present invention contemplates that the slots/discontinuities can be formed in the wheel section 36 and/or the shroud 40. Further, the techniques of the present invention are applicable to wheel assemblies that are unshrouded. For example, in one embodiment of the present invention, slots 41 are machined within cast shroud 40 at predetermined locations. FIG. 2 shows a turbine wheel assembly 34a in which 5 slots 41a–e have been incorporated into shroud 40, thus grouping blades 38 within 5 distinct groups. Each grouping of blades is located between adjacent slots, each blade within a group being connected to at least one adjacent blade by one of shroud sections 40a–e. One embodiment of the present invention includes a heretofore-unknown method for choosing the number the slots based upon the vibratory response of the wheel assembly.

In one embodiment of the present invention, slots 41 are machined into a cast shroud 40 at predetermined locations. In this embodiment, slots 41 are 0.01–0.03 inches wide, and are angled relative to centerline 31 so that the resultant slot is entirely between two adjacent blades 38. This angled slot is machined within the center portion of shroud 40 and does not extend completely across the shroud. Instead, approximately 0.025 inches of uncut shroud are present after machining at each end of the machined slot. The slot locally weakens shroud 40, such that during operation of wheel assembly 34 the stresses in the uncut portion of the shroud exceed the stress limit of the material. Cracks form from each end of the slot and propagate through the uncut portion to the free edge. Thus, the machine slots serve as stress risers and ensure a predetermined number of shroud cracks or separations at each of the predetermined locations. Although a specific slot geometry has been described, those of ordinary skill in the art will recognize other applicable slot geometries and sizes are encompassed within the present invention.

For purposes of the finite element models described herein, each grouping of blades is defined by a complete break on either end of the shroud section representative of the machined slot after the shroud has cracked during operation. As shown in FIG. 2, the slots 41a–e are depicted as slots that completely separate adjacent shroud sections. For example, slot 41c completely separates shroud section 40b from shroud section 40c.

Figure 3:
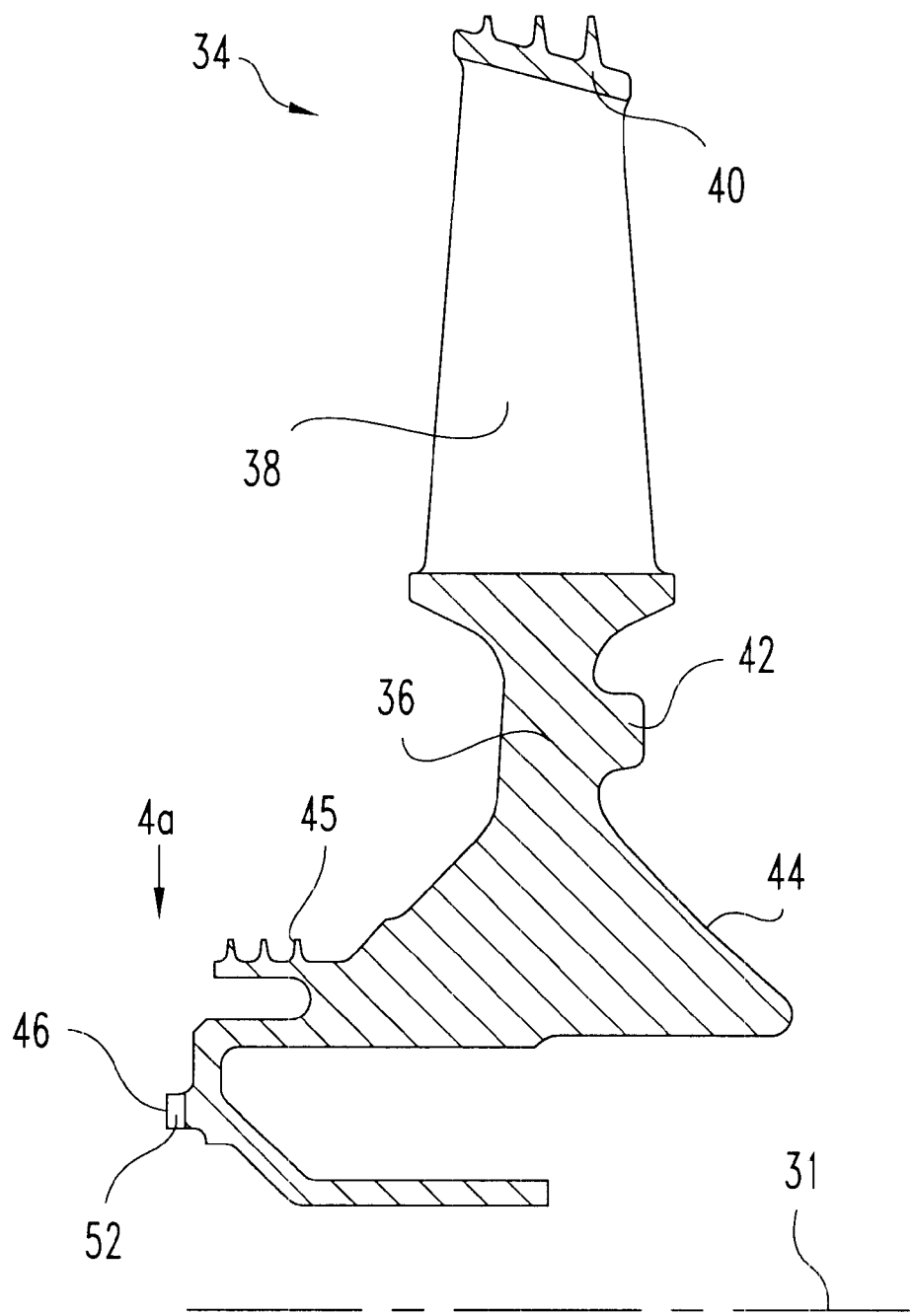
FIG. 3 is a cross-sectional view of the wheel assembly of FIG. 2, as taken through plane 3 of FIG. 2.

FIG. 3 is a sectional view of the turbine wheel assembly of FIG. 2 as taken through plane 3 of FIG. 2. Wheel assembly 34 includes a wheel section 36 with a plurality of turbine blades 38 coupled thereto. A circumferential shroud 40 extends circumferentially around the tips of blades 38. Shroud section 40 interconnects a plurality of blades. In a preferred embodiment, shroud section 40 is cast integrally with blades 38 and wheel 36. In another embodiment of the present invention, each turbine blade 38 is cast with its own shroud section 40, adjacent shroud sections being coupled in a manner well known in the art, such as z-shrouds.

Wheel portion 36 of wheel assembly 34 includes a rim section 42 proximate to blades 38 and a hub section 44. Hub section 44 includes a curvic coupling 46 which provides a mechanical drive coupling to another rotating component such as a shaft or another turbine wheel. While a curvic coupling has been described other types of attachment devices, frictional dissipation of energy devices, and couplings are contemplated herein. FIG. 4a shows a view of curvic coupling 46 of wheel 36 as viewed from position 4a of FIG. 3. As is well known in the art, curvic coupling 46 includes an alternating series of projected lands 48 and roots 50, interconnected by outwardly angled contact faces 52.

FIG. 4b shows a perspective view of the curvic coupling of FIG. 4a. Curvic coupling 46 can transmit or receive torque from another rotating component, such as a shaft or wheel, that has a mating curvic coupling. The two rotating components are held together with the mating curvic couplings in compression by means well known in the art, such as a tie bolt. In other embodiments of the present invention, a coupling, such as a curvic coupling, is part of rim section 42, and couples wheel portion 36 to a wheel spacer, as is commonly known in the art. In one embodiment, wheel section 36 also includes a labyrinth seal 45 with a plurality of knife edges for discouraging air flow between adjacent components.

In one embodiment of the present invention, a structure is mathematically modeled. In a preferred embodiment, a wheel assembly for a gas turbine engine including a turbine wheel with a drive coupling such as a curvic coupling and a plurality of turbine blades are modeled. However, the present invention is applicable to other structures, such as described above including but not limited to pumps and geartrains, in which there is a first structural system and a second structural system, as previously described.

As described herein, elements with a two number designation (for example turbine wheel assembly 34) refer to a component of gas turbine engine 20. Three digit numbers (for example single blade model 134) refers to a finite element computer model of the two digit component. Further, three digit numbers beginning with a one (1) refer to elements of a single blade computer model, three digit numbers beginning with a two (2) refer to a five blade computer model, and three digit numbers beginning with three (3) refer to a seven blade computer model.

Computer models 134, 234, and 334 are adapted and configured to be mathematically processed by a finite element analysis program, including programs such as NASTRAN, PATRAN, or ANSYS, for example. Those of ordinary skill in the art will recognize the applicability of a wide variety of different finite element programs to the methods described herein.

Figure 5:
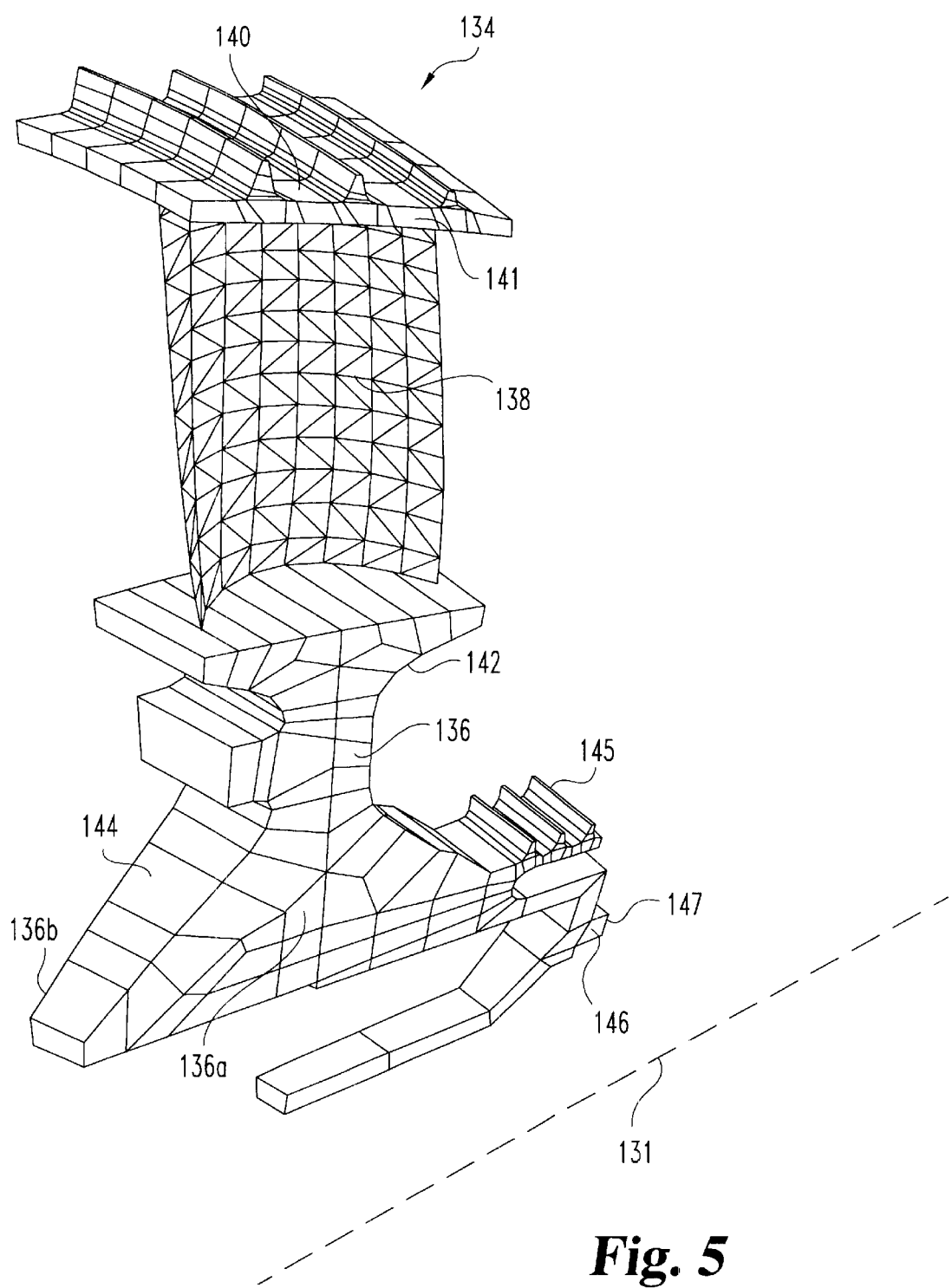
FIG. 5 is a perspective view of a finite element model of a wheel assembly according to one embodiment of the present invention.

FIG. 5 shows a perspective view of a single blade finite element wheel assembly model 134, model 134 being one mathematical representation of wheel assembly 34. Model 134, as well as the other finite element models described herein, are mathematically constructed from combinations of plate elements, solid elements, and other types of elements known to those of ordinary skill in the art. All finite element models depicted herein model only portions of wheel assembly 34, yet these models use boundary conditions of symmetry on the faces of the models to analytically simulate complete wheel assembly models, as is well known to those of ordinary skill in the art.

Model 134 includes a wheel model 136 constructed with solid elements and linked to a blade model 138 constructed of plate elements. A shroud model 140 constructed from solid elements couples to the tip of blade model 138. Wheel model 136 includes a hub section 144 and a rim section 142. Curvic coupling model 146 having element face 147 is included in wheel model 136. Model centerline 131 indicates a line of axial symmetry.

Figure 6:
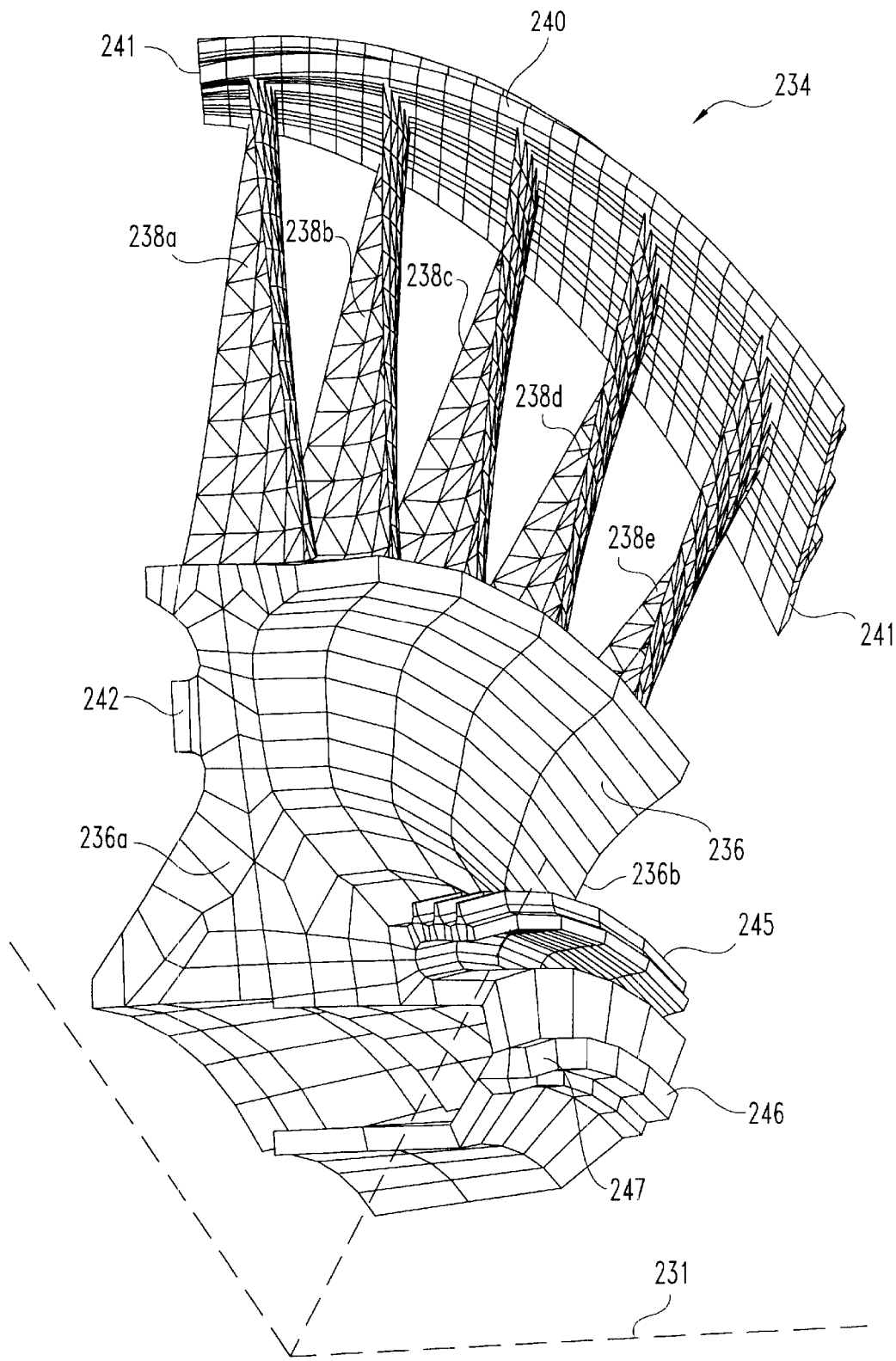
FIG. 6 is a perspective view of a finite element model of a wheel assembly according to another embodiment of the present invention.

FIG. 6 shows a perspective view of a multiple blade wheel assembly model 234. Model 234 is constructed from five (5) sets of the elements within Model 134. Model 234 includes a wheel section 236 coupled to five blade models 238a–e. Wheel section 236 includes section faces 236a and 236b on either end of section 236. Section faces 236a and 236b include boundary conditions of symmetry, which cause wheel section 236 to behave mathematically as if it were a complete wheel. In contrast, end faces 241 of shroud model 240 do not include any limitations of symmetry that would mathematically link them to other, adjacent shrouds 240. In this manner, although wheel section 236 behaves as a complete wheel, shroud 240 and the five blades 238 coupled thereto exist as a grouping of elements on blade model 234 that respond as a group.

A shroud model 240 couples the tips of the blade models. Wheel model section 236 includes a curvic coupling model 246 comprised of five coupling model elements, each model element of coupling model 246 having a face 247. Different boundary conditions are imposed on the five axial end faces 247 of wheel model 234. One discovery of the present invention regards modeling of stresses within a curvic coupling. In a preferred embodiment of the present invention, the juncture nodes surrounding the axial faces 247 have imposed on them boundary conditions of no translation in any direction. This boundary condition simulates compression of adjacent curvic couplings, such as between adjacent wheels or between a wheel and a shaft. Note that even though the nodes surrounding the end faces 247 have imposed on them conditions of no translation, the other nodes of the five solid elements 246 are free to translate or rotate as part of the mathematical solution of the finite element modeling algorithm. Therefore, each of the curvic coupling elements 246 will have in them a stress state corresponding to the solution of the finite element model.

Figure 7:
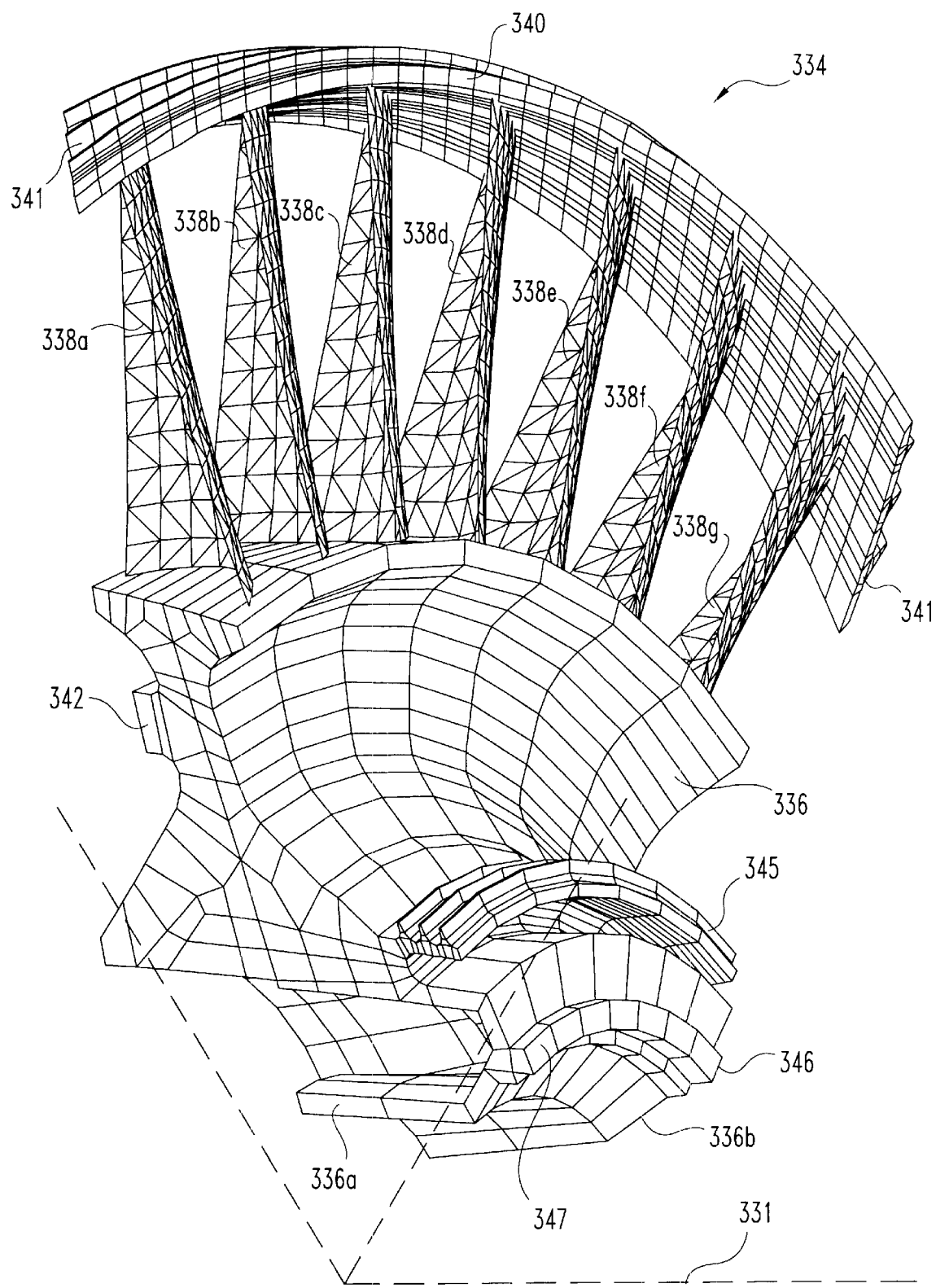
FIG. 7 is a perspective view of a finite element model of a wheel assembly according to another embodiment of the present invention.

FIG. 7 shows a perspective view of a multiple blade wheel assembly model 334. Model 334 includes a wheel section 336 coupled to seven (7) blades 338a–g. Blades 338a–g are coupled to a shroud section model 340. Shroud section model 340 includes slot models 341 on either face of model 340 that are not constrained to move as if attached to an adjacent shroud section model.

Wheel section model 336 includes a curvic coupling model 346. Each solid element of coupling model 346 includes an axial element face 347. The nodes surrounding each axial element face 347 are constrained from translational movement, so as to simulate attachment of coupling model 346 to an adjacent curvic coupling.

One aspect of the present invention involves the use of a mathematical modeling technique that results in a prediction of damping of a vibratory response by a frictional interface between adjacent members. In one embodiment of the present invention, the mathematical model of the turbine wheel includes one or more elements, which represent a model of the frictional interface between the turbine wheel and an adjacent rotating component. In a preferred embodiment, the frictional interface is a coupling, mathematically represented by solid elements. In a more preferred form the frictional interface is a curvic coupling. While much of the description will be made with reference to a coupling and/or curvic coupling, the techniques of the present invention are equally applicable to general frictional interfaces unless specifically stated to the contrary. However, those of ordinary skill in the art will recognize that the present invention encompasses other couplings which can exhibit sliding friction as a dampening mechanism, and also elements other than solid elements for modeling the drive coupling. As yet another example, in another embodiment of the present invention the wheel assembly includes a curvic coupling in the rim section for coupling to a wheel spacer, the wheel spacer also coupling to an adjacent second turbine wheel.

The model of the drive coupling is mathematically constrained, or grounded, so as to simulate coupling to another rotating component. In one form of the present invention constraining has zero degrees of freedom, and in a second form constraining has all degrees of freedom, and in a third form the number of degrees of freedom in constraining falls within the range between zero degrees and all degrees. However, the constraints are not so complete or thorough as to eliminate all strain within the element. In one embodiment, a curvic coupling is modeled with a solid element arranged such that one face of the solid element is oriented generally perpendicular to the wheel assembly centerline and represents coupling between that element and a curvic coupling of an adjacent rotating component. The element face is surrounded by a plurality of finite element juncture nodes. These juncture nodes are grounded by constraining their movement in any translational direction. Therefore, these juncture nodes are still able to rotate in three orthogonal directions. Further, other juncture nodes of the particular solid element are free to both rotate and translate. With this manner of grounding, the solid element representing the coupling model is simulated as being in contact with an adjacent curvic coupling, yet is still able to deform and generate internal strains and stresses. Those of ordinary skill in the art will recognize other combinations of constraints on the curvic coupling model which simulate the coupling of adjacent drive couplings, but which also permit a prediction of coupling strain, stress or deflection.

In one embodiment of the invention, discrete elements of the structure are grouped in a first pattern representative of the first structural system. As an example of one embodiment, the blades of a wheel assembly are grouped together with a shroud section. The shroud section interconnects the blade tips. Each shroud section preferably couples two (2) or more adjacent blades, although the present invention also is applicable to analysis of individual blades not interconnected to adjacent blades. The wheel assembly includes a plurality of groups arranged in a first pattern. As one example, a wheel assembly included a pattern of five (5) groups, each group including seven (7) blades. Adjacent shroud sections are substantially uncoupled from one another so that each group exhibits behavior as a group, corresponding to the first structural system discussed earlier. However, the groups are also interconnected through the rim section of the wheel such that the groups and the wheel exhibit combined behavior, corresponding to the second structural system previously discussed.

The vibratory modal responses of each harmonic family are computed by selecting the appropriate dynamic response solution of the particular finite element program. Because of the groupings, a particular harmonic family has aliased into it responses of other harmonic families according to the sum and difference relationships previously described. As an example, for a wheel assembly with five (5) groupings for the 1D harmonic family there are included responses from the 1D, 4D, 6D, 9D, and 11D harmonic families as shown in Table 3.

In one embodiment of the present invention, a predetermined vibratory displacement of a discrete structural element can be imposed upon or forced upon the computer algorithm performing the solution of vibratory responses. As an example, a juncture node on one of the blade models at a three-quarter span, mid-chord location can be forced to respond by 0.001 inch. By imposing or forcing a predetermined displacement at a predetermined location for each of the vibratory responses, the finite element program solution calculates strains and stresses. With this calculation there is a basis for comparing curvic coupling model stresses and strains between different vibratory modal responses.

Although reference has been made to imposing a predetermined vibratory displacement upon a node of a blade model at a particular location, those of ordinary skill in the art will recognize that the present invention also contemplates imposition of predetermined velocity, acceleration, or other displacement-related parameter upon the model, and also that the displacement-related parameter can be imposed upon portions of the model other than a blade. For example, for those embodiments of the present invention involving a gear, the displacement-related parameter can be imposed upon a gear tooth.

After computing the vibratory modal responses of the structure with the first system arranged in a first pattern, the components of the first system are then regrouped into a second pattern. For example, the 35 blades of the wheel assembly can also be grouped into a pattern of seven (7) shroud sections, each shroud section coupling five (5) blades. As another example, a wheel assembly with 36 blades could be grouped in sections which include 2, 4, 6, or 9 blades in each section. Preferably, each section includes the same number of components as each other section. However, the present invention also contemplates groupings in which one or more sections have a greater or fewer number of blades than other sections. For example, in a wheel assembly with 35 blades, the present invention also includes those embodiments with eight (8) shroud sections, each including four (4) blades, and one (1) shroud section including three (3) blades. As another example, the present invention also contemplates a 35-blade wheel assembly arranged in a pattern of ten (10) shroud sections in which five (5) of the shroud sections each include four (4) blades, and five (5) other sections each include three (3) blades, the two different sections being arranged around the wheel in an alternating pattern. Those of ordinary skill in the art will recognize many other variations of shroud sections and patterns contemplated within the present invention.

After the discrete elements of the first structural system have been regrouped in a second pattern, for example, a wheel assembly including seven (7) shroud sections, each shroud section including five (5) blades, the vibratory modal responses of the wheel assembly are recomputed. A predetermined displacement is imposed for the solution of the vibratory modal responses so as to compute stress or strain proximate to the drive coupling model that may be compared to the coupling stress or strain computed with the blades grouped in the first pattern.

By comparing the first coupling stress to the second coupling stress, it is possible to estimate which vibratory modal responses will include significant dampening from the drive coupling. In the embodiment where the drive coupling is a curvic coupling, it is believed that at levels of strain and stress higher than a particular threshold, there may be separation of adjacent curvic couplings with resultant sliding friction on the coupling faces during engagement and disengagement. It is believed that there is a threshold above which the stresses and strains must rise, and that this threshold is related to the amount of compression that holds the couplings together. For those embodiments where the adjacent curvic couplings are held in compression by a tie bolt, the threshold stress or strain value would be related to the tension in the tie bolt and pressure loading on the wheel assemblies.

Figure 11:
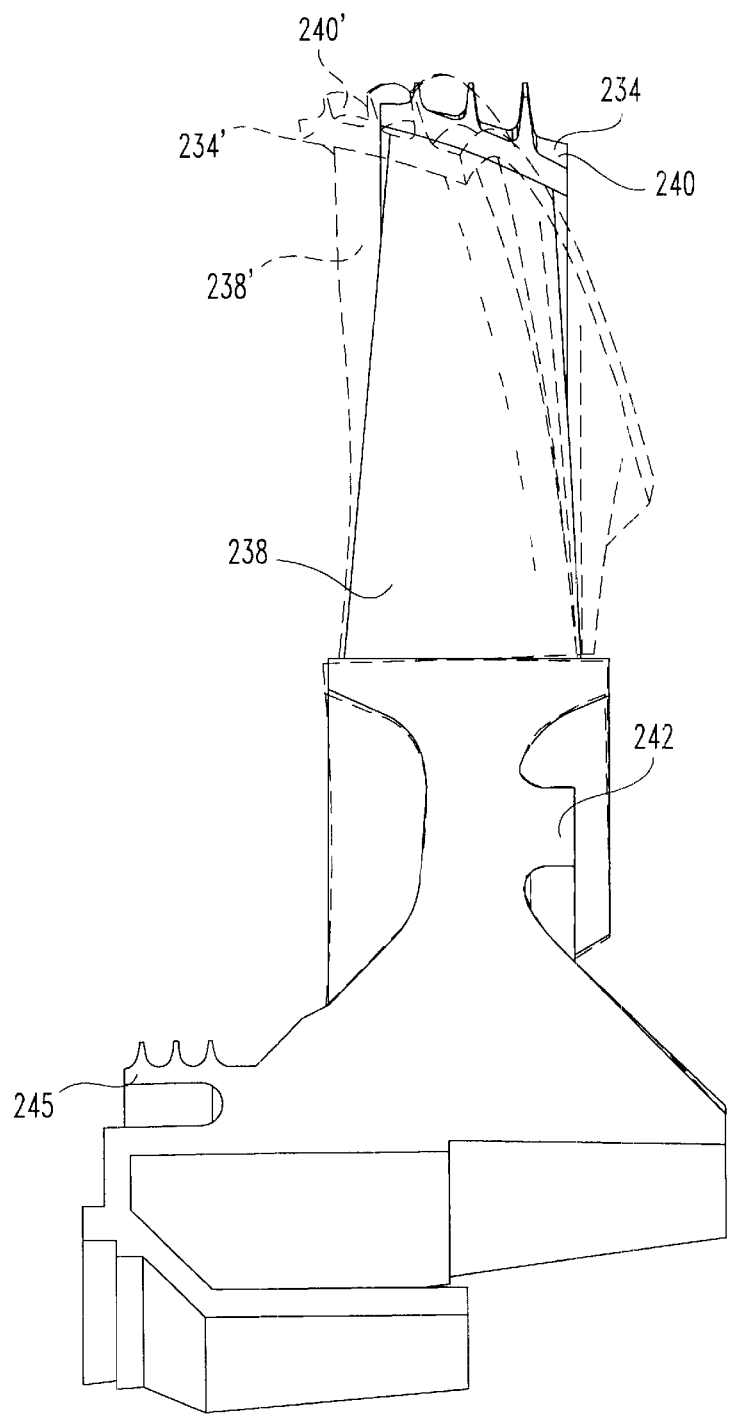
FIG. 11 is a side and bottom perspective view of the model of FIG. 6, with a vibratory modal response overlaid.
Figure 12:
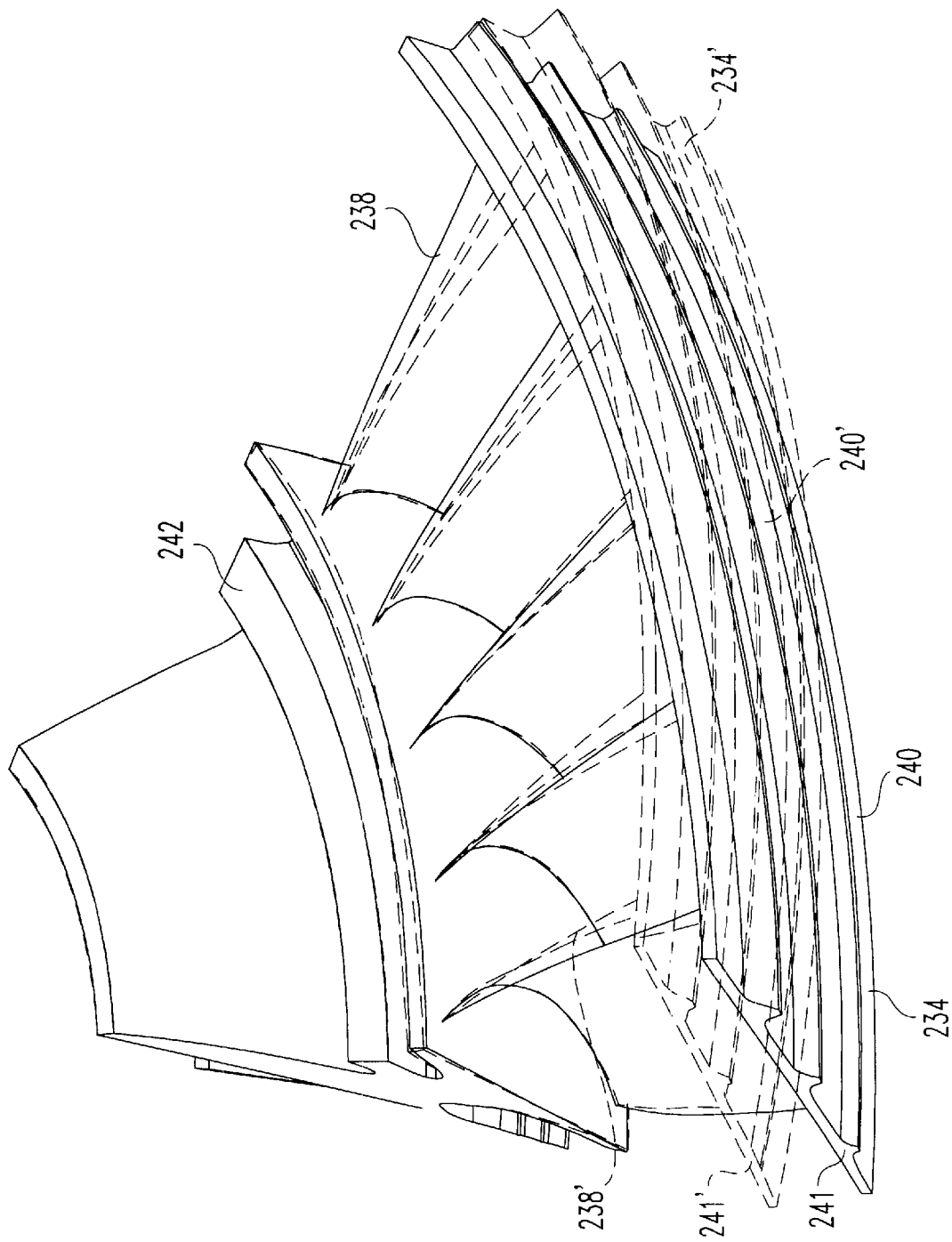
FIG. 12 is a top and front perspective view of the model of FIG. 6, with a vibratory modal response overlaid.

FIGS. 11 and 12 represent side and top perspective views, respectively, of wheel assembly model 234. In both figures, the dotted line representation designated with prime (') marks is the 2D2 vibratory modal response superimposed on the solid line input model. Note that in FIGS. 11–14 only the outline of the models and solutions are shown. The individual elemental boundaries, as best seen in FIGS. 5–7, are not shown for sake of clarity and also to emphasize the shape of the vibratory modal response. Also note that in FIGS. 11–14 the forced displacement of 0.001 inches at a juncture node on a blade has been greatly increased so as to more clearly show the shape of the mode.

Figure 13:
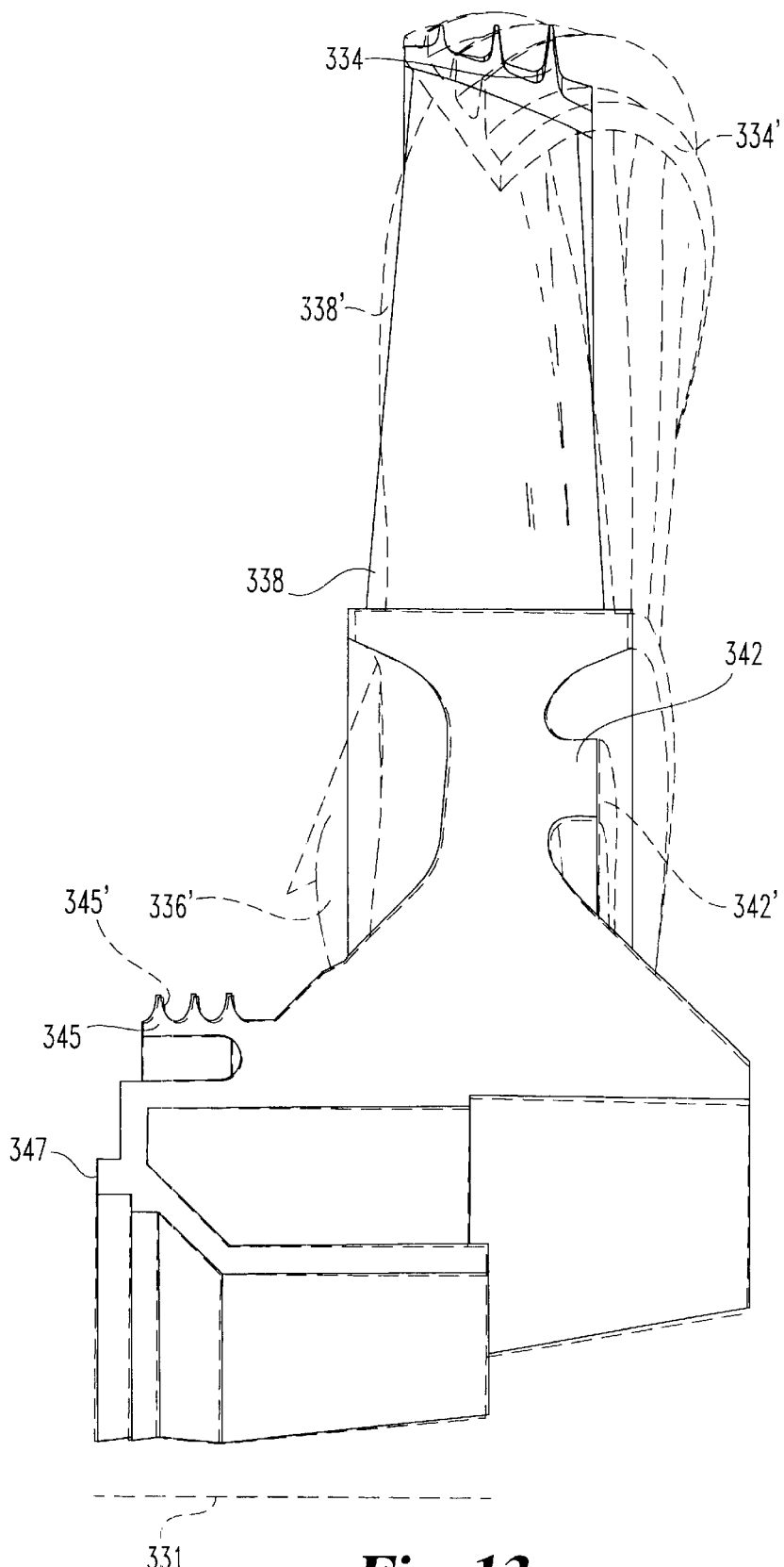
FIG. 13 is a side and bottom perspective view of the model of FIG. 7, with a vibratory modal response overlaid.
Figure 14:
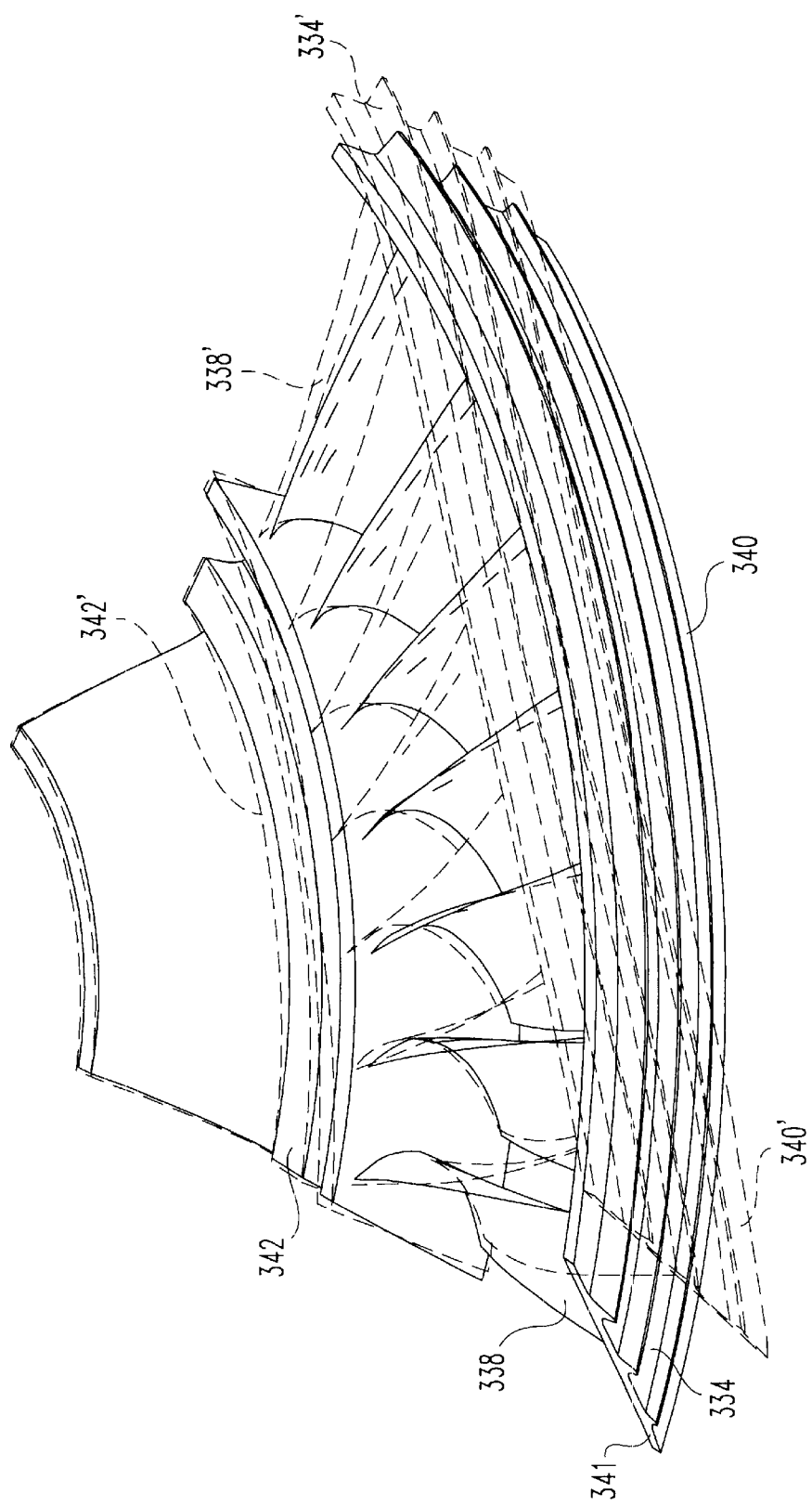
FIG. 14 is a top and front perspective view of the model of FIG. 7, with a vibratory modal response overlaid.

As can be seen in FIGS. 11 and 12, the 2D2 vibratory modal response of the five (5) group wheel assembly model 234 exhibits twisting of the shroud, which can be best seen in FIG. 13. Shroud section 240 twists to the position shown by responding shroud section 240'. Note also the corresponding shifts of position of the five (5) blades 238 to the 238' position. However, as can be best seen in FIG. 11, there appears to be little response within rim section 242 or labyrinth seal model 245. The prime (') modal responses of models 242 and 245 lie substantially on top of the respective models.

In contrast, the 2D2 vibratory modal response of the seven (7) group wheel assembly model 334 shows increased motion within wheel section 336. As can be seen in both FIGS. 13 and 14, rim section 342 bends to a modal position 342' with significantly higher displacement. Note also the response of labyrinth seal model 345 to the 345' position. It is believed that these visibly graphic representations of vibratory response within the wheel section tend to indicate increased strain within curvic coupling model 347, even though the 347' dotted position lies on top of the input model. Note also that shroud 340 responds by bending, as noted in dotted line response 340'.

Figure 9:
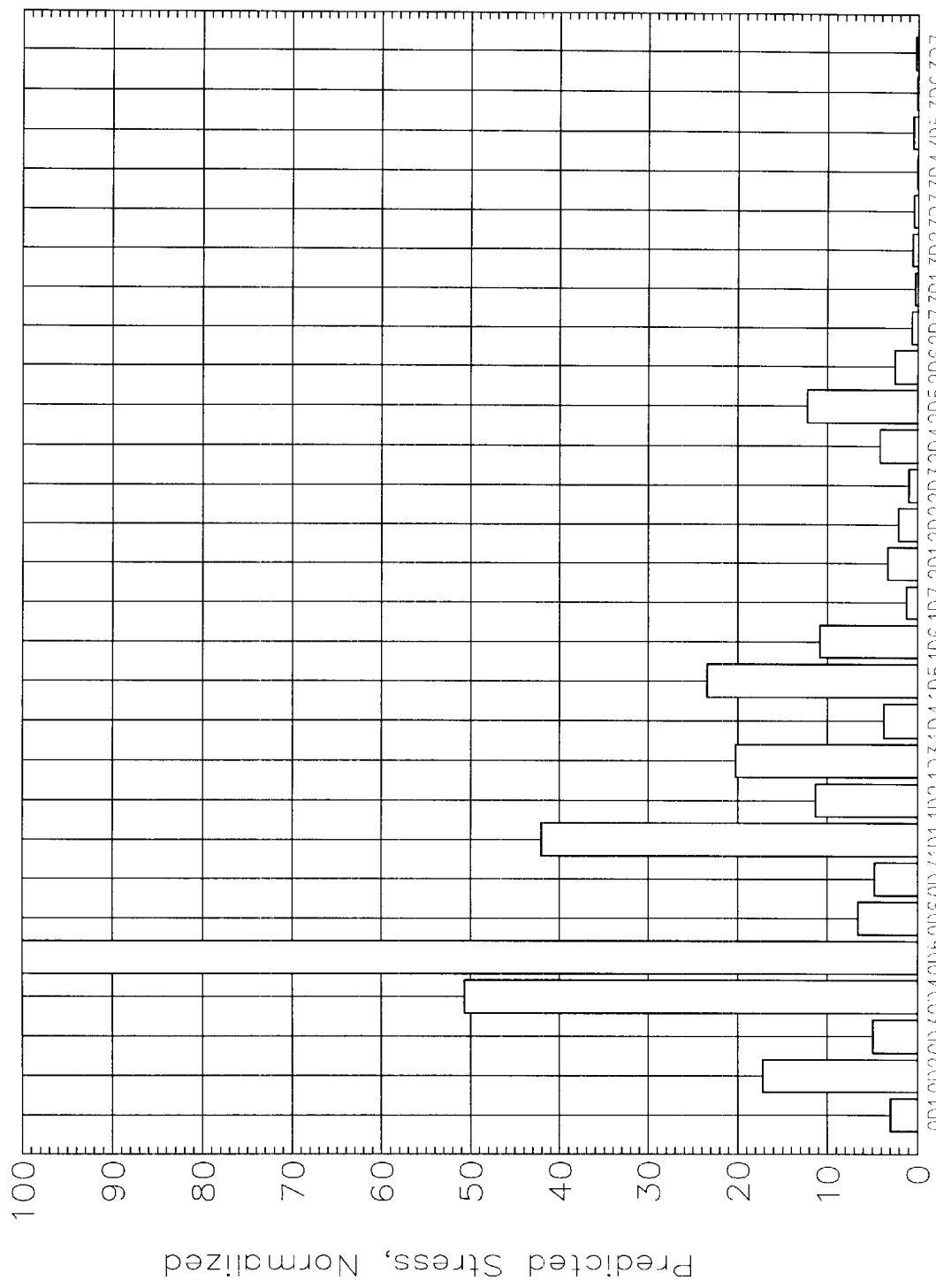
FIG. 9 is a graphical representation of coupling stress as a function of vibratory model.
Figure 10:
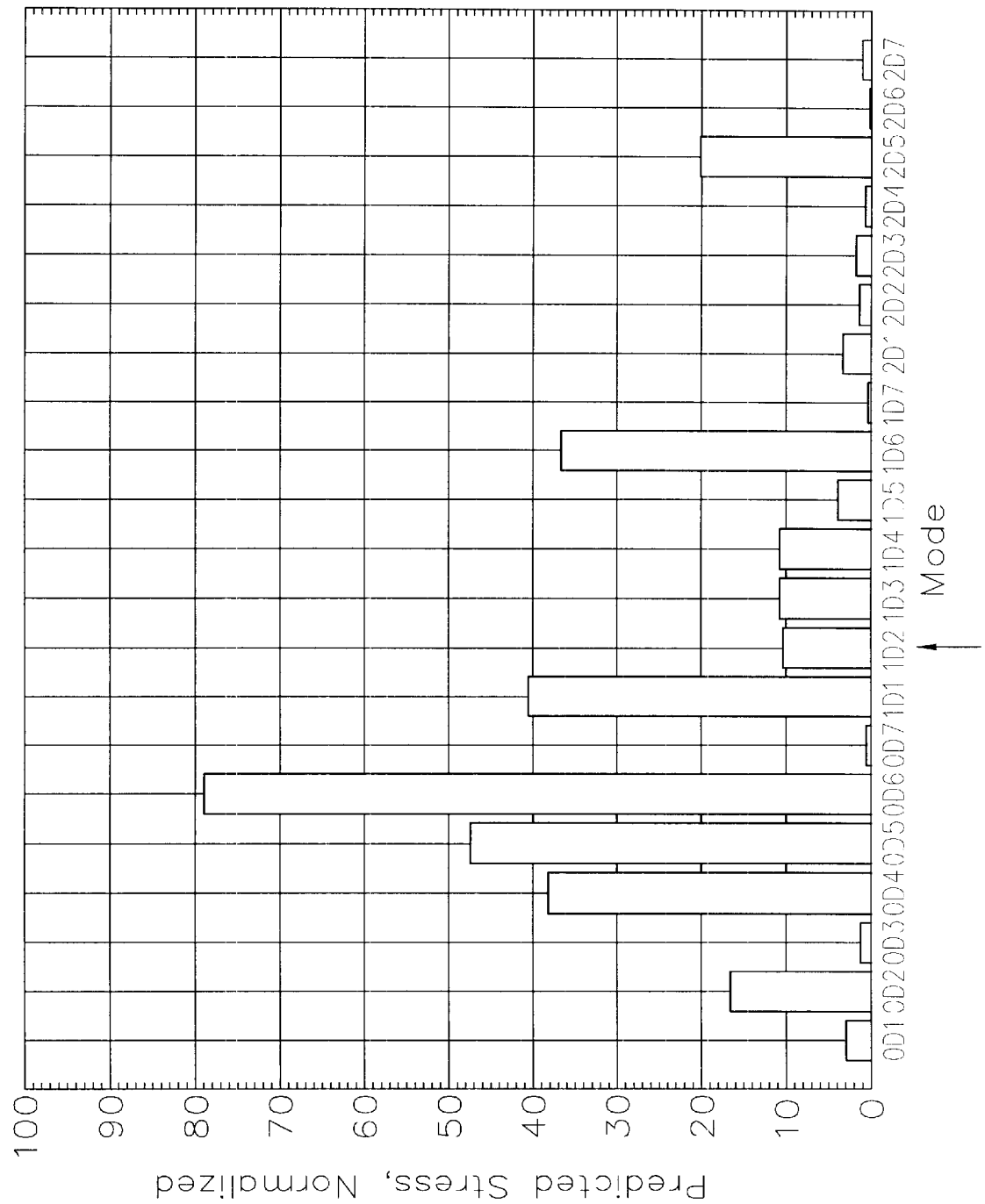
FIG. 10 is a graphical representation of coupling stress as a function of vibratory model.

FIGS. 9 and 10 compare predicted stress within the curvic couplings as a function of the vibratory mode. Stresses shown in these graphs have been normalized by the maximum stress experienced by any single mode. This maximum curvic stress occurred in this specific example with the 0D5 mode as shown in FIG. 9. All other stresses shown in FIGS. 9 and 10 have been normalized by the stress, such that, for example, the 1D6 mode of FIG. 10 responds with a coupling stress of about 78% of the 0D5 stress response in FIG. 9.

FIG. 9 depicts the predicted, normalized coupling stresses for a 35 blade turbine wheel, with the blades arranged in a pattern of seven (7) groupings, each grouping comprising five (5) blades. FIG. 10 corresponds to the same turbine wheel, except that the blades have been arranged in five (5) equal groupings of seven (7) blades each. The stresses of FIG. 9 were computed using model 234. The stresses of FIG. 10 were predicted using model 334. In general, stresses in the wheel coupling are highest for the lower order diametral families, and decrease as the order of the family increases. One of the effects of regrouping the wheel assembly from seven (7) groups to five (5) groups is a shift in the maximum curvic stress from the 0D5 mode (as seen in FIG. 9) to the 0D6 mode (as seen in FIG. 10).

In one embodiment of the present invention, by a combination of finite element computer analysis and engine testing, it has been determined that vibratory modes with predicted curvic stresses less than about 5 KSI exhibit lightly damped resonant response during testing. Those vibratory modes exhibiting curvic stresses in excess of 10 KSI generally show higher levels of damping than the 5 KSI or less modal shapes. Therefore, it is believed that for a wheel assembly of the type described herein and modeled as described herein, the threshold curvic stress value for predicting increased damping is between 5 KSI and 10 KSI. However, those of ordinary skill in the art will recognize that the predicted threshold value will vary depending upon the modeling method and component design, and should be determined empirically. For example, forcing modal displacements other than 0.001 inch, or changing the tensile force in the tie bolt, can change the threshold value for predicting slippage of the drive coupling.

Thus in one embodiment of the present invention, there is a vibratory modal response that is lightly damped. By appropriately grouping the discrete components, it is possible to alias the harmonic family of which the vibratory response is a member such that the harmonic family is aliasingly associated with other harmonic families with higher levels of dampening, In one embodiment of the present invention, there is a predetermined engine order, an integral multiple (M) of rotational speed, that aliases into and resonates one or more natural frequencies of a first harmonic family of a wheel assembly, the family being characterized by a first integral number (N1) of diametral node lines. The integral multiple (M) of rotational speed is the same as the order of the engine order (EO) discussed herein. The first integral number is different than the first integral multiple (M N1). The determination that the multiple (M) of rotational speed resonates a number (N 1) of diametral node lines may be made by testing, computer finite element analysis, other computer analysis, observation, or other methods commonly employed by those of ordinary skill in the art.

In this embodiment, the discrete components of the structural system, such as the blades of the wheel, may be grouped such that multiple (M) of rotational speed no longer aliases into and resonate one or more natural frequencies of the (N1) harmonic family. Instead, by appropriately grouping the components the multiple (M) of rotational speed can be made to alias into and resonate one or more natural frequencies of a second harmonic family characterized by a second integral number (N2) of diametral node lines. In one embodiment, the blades are grouped such that the second harmonic family is of an order less than the first harmonic family (N2≦N1). In this preferred embodiment, it is believed that the lower order harmonic families tend to include increased vibratory motion of the wheel section as compared to higher order harmonic families. Accompanying this increased motion of the wheel section is another tendency of increased stress and strain in the curvic coupling, which is believed to be an indicator of frictional damping. The first and second integral numbers (N1, N2) are the same as the order of a harmonic family as discussed herein.

In one embodiment of the present invention, there is a gas turbine engine with five (5) struts located in the gas path adjacent to and upstream of a wheel assembly with shrouded turbine blades. If the blades are arranged in a pattern of seven (7) equal groupings, it can be seen from Table 2 that a 5EO disturbance, such as five (5) struts, can excite the 2D harmonic family. If the 2D harmonic family also contains a lightly damped vibratory modal response, then high stresses in the wheel assembly can result from the 5EO excitation. However, by rearranging the shrouds into a pattern of five (5) equal groupings, the 5 EO excitation aliasingly couples into the 0D family and not the 2D family, as seen in Table 3. Thus, any lightly damped vibratory response of the 2D family would no longer be excited by the 5EO excitation created by five (5) struts.

According to other methods of analyzing and designing wheel assemblies, the structural order of the hardware, such as a predetermined number of gaspath disturbances (PN), should be different than the engine order (M) to be avoided, so as to avoid excitation of resonant modes of the hardware. However, by one embodiment of the present invention it is shown that it is possible to have the structural order and engine order be the same (PN=M), such that the engine order aliasingly couples into a lower order harmonic family with sufficient motion of a coupling to provide increased damping of some excited resonant modes. Most preferably, aliasingly coupling into the 0D or 1D harmonic families has been shown to provide motion of the wheel coupling with subsequent increased damping.

Although various embodiments of the invention including computer analysis have been described, those of ordinary skill in the art will recognize the applicability of engine testing, or a combination of engine testing and computer analysis to the present invention. For example, the present invention also contemplates testing of multiple wheel assemblies. For example, a first wheel assembly with the blades grouped in a first pattern can be fabricated and tested. By reviewing appropriate test data, such as from strain gages, accelerometers, optical sensors, or other instruments known to those of ordinary skill in the art, an assessment can be made of the aliasing interactions among the various engine orders and resonant frequencies and the degree of damping within certain vibratory modes. After determining an interaction of engine order and resonant frequency with undesirable stresses or motions, a second wheel assembly where the blades are grouped in a second pattern can be fabricated so as to alias the predetermined resonant frequency to a harmonic pattern with increased damping, or to a harmonic pattern that is no longer excited by a particular engine order. Those of ordinary skill will also recognize that the present invention contemplates combinations of testing and analysis.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

TABLE 1

| Harmonic Family (D) | n = 0 sum and difference | n = 1 | | n = 2 | |
|---|---|---|---|---|---|
| | | Difference (n G − D) | sum (n G + D) | difference (n G − D) | sum (n G + D) |
| | | Groupings Number (nG) where G = 35 | | | |
| 0 | 0 | | 35 | | 70 |
| 1 | 1 | 34 | 36 | 69 | 71 |
| 2 | 2 | 33 | 37 | 68 | 72 |
| 3 | 3 | 32 | 38 | 67 | 73 |
| 4 | 4 | 31 | 39 | 66 | 74 |
| 5 | 5 | 30 | 40 | 65 | 75 |
| 6 | 6 | 29 | 41 | 64 | 76 |
| 7 | 7 | 28 | 42 | 63 | 77 |
| 8 | 8 | 27 | 43 | 62 | 78 |
| 9 | 9 | 26 | 44 | 61 | 79 |
| 10 | 10 | 25 | 45 | 60 | 80 |
| 11 | 11 | 24 | 46 | 59 | 81 |
| 12 | 12 | 23 | 47 | 58 | 82 |
| 13 | 13 | 22 | 48 | 57 | 83 |
| 14 | 14 | 21 | 49 | 56 | 84 |
| 15 | 15 | 20 | 50 | 55 | 85 |
| 16 | 16 | 19 | 51 | 54 | 86 |
| 17 | 17 | 18 | 52 | 53 | 87 |

TABLE 2

| Harmonic Family | Groupings Number (n G) where G = 7 | | | | |
|---|---|---|---|---|---|
| (D) | n = 0 | n = 1 | | n = 2 | |
| 0 | 0 | | 7 | | 14 |
| 1 | 1 | 6 | 8 | 13 | 15 |
| 2 | 2 | 5 | 9 | 12 | 16 |
| 3 | 3 | 4 | 10 | 11 | 17 |

TABLE 3

| Harmonic Family | Groupings Number (n G) where G = 5 | | | | |
|---|---|---|---|---|---|
| (D) | n = 0 | n = 1 | | n = 2 | |
| 0 | 0 | | 5 | | 10 |
| 1 | 1 | 4 | 6 | 9 | 11 |
| 2 | 2 | 3 | 7 | 8 | 12 |

What is claimed is:

1. A method for designing a gas turbine engine component, comprising:
   preparing a finite element model of a wheel assembly coupled to another rotating member within a gas turbine engine, the model including a wheel with a plurality of blades and a coupling for coupling the wheel to the other rotating member;
   constraining the model at the coupling;
   grouping the blades in a first pattern;
   computing a vibratory modal response of the model, the response including a first predictor proximate to the coupling;
   regrouping the blades in a second pattern;
   recomputing a vibratory modal response of the model, the response including a second predictor proximate to the drive coupling;
   comparing the first predictor to the second predictor; and
   selecting the pattern with the higher predictor.

2. The method according to claim 1 wherein said first predictor, defines a first coupling stress and said second predictor defines a second coupling stress, and wherein said selecting the pattern with the higher predictor defines selecting the pattern with the higher coupling stress.

3. The method according to claim 2, wherein said first coupling stress is indicative of a first coupling interface damping and said second coupling stress is indicative of a second coupling interface damping, and said selecting the pattern with the higher coupling stress is indicative of selecting the pattern with the higher damping.

4. The method according to claim 1 wherein said first predictor defines a first deflection said second predictor defines a second deflection, and wherein said selecting the pattern with the higher predictor defines selecting the pattern with the greater deflection.

5. The method according to claim 2, wherein said first deflection is indicative of a first coupling interface damping and said second deflection is indicative of a second coupling interface damping, and said selecting the pattern with the greater deflection is indicative of selecting the pattern with the higher damping.

6. The method according to claim 1, wherein the model includes a shroud connecting the blades, and said grouping is by connecting a first number of blades to a section of the shroud.

7. The method according to claim 6, wherein the model includes a shroud connecting the blades, and said regrouping is by connecting a second number of blades to the shroud, the first number being different than the second number.

8. The method according to claim 1, wherein the coupling is a drive coupling for coupling the wheel assembly to one of another wheel assembly or a shaft.

9. The method according to claim 1, wherein the coupling couples the wheel assembly to a spacer.

10. The method according to claim 8, wherein the coupling is a curvic coupling.

11. The method according to claim 1, wherein the coupling is a curvic coupling and said constraining simulates coupling the curvic coupling to the other rotating member.

12. The method according to claim 1 which further comprises imposing a predetermined vibratory displacement upon a blade during said computing.

13. The method according to claim 12 which further comprises reimposing a predetermined vibratory displacement upon a blade during said recomputing.

14. The method according to claim 13, wherein the model includes a shroud connecting the blades, and said grouping is by connecting a first number of blades to a section of the shroud.

15. The method according to claim 14, wherein the model includes a shroud connecting the blades, and said regrouping is by connecting a second number of blades to a section of the shroud, the first number being different than the second number.

16. A method for designing a wheel assembly for a gas turbine engine, comprising:
   providing a gas turbine engine with a wheel assembly, the wheel assembly including a wheel and a plurality of blades, the wheel assembly being characterized by a plurality of harmonic families, each family being characterized by an integral number of diametral node lines, each family including a plurality of natural frequencies, the wheel assembly capable of vibrating at the natural frequencies, the gas turbine engine capable of rotating in a range of rotational speeds;
   determining an integral multiple of rotational speed that resonates one or more natural frequencies of a first harmonic family, the first harmonic family being characterized by a first integral number of diametral node lines, the first integral number being different than the integral multiple; and
   grouping the blades such that the integral multiple of rotational speed does not resonate the one or more natural frequencies of the first harmonic family, the integral multiple of rotational speed resonating one or more natural frequencies of a second harmonic family, the second harmonic family being characterized by a second integral number of diametral node lines, the second integral number being different than the first integral number.

17. The method according to claim 16, wherein the second integral number is less than the first integral number.

18. The method according to claim 17, wherein the second harmonic family aliasingly couples into the 0D harmonic family.

19. The method according to claim 12, wherein the second harmonic family aliasingly couples into the 1D harmonic family.

20. The method according to claim 16, wherein the gas turbine includes a predetermined number of gaspath disturbances, and the predetermined number is the same as the integral multiple.

21. The method according to claim 20, wherein the gaspath disturbances are vanes upstream of the wheel assembly.

22. The method according to claim 20, wherein the gaspath disturbances are struts upstream of the wheel assembly.

23. The method according to claim 16, wherein the wheel assembly includes a curvic coupling for coupling a second rotating member to the wheel assembly and said regrouping increases stress proximate to the curvic coupling.

24. The method according to claim 16, wherein said providing includes a second rotatable member coupled to the wheel and the second rotatable member and the wheel are coupled by a curvic coupling.

25. The method according to claim 24, wherein the second rotatable member is a second wheel assembly.

26. The method according to claim 24, wherein the second rotatable ember is a shaft.

27. The method according to claim 24, wherein the second rotatable member is a spacer.

28. The method according to claim 16, which further comprises preparing a finite element model of the wheel assembly to predict at least one of the plurality of natural frequencies.

29. The method according to claim 16, wherein the wheel assembly includes a plurality of shrouds, and each shroud connects an equal number of blades.

30. The method according to claim 16, wherein the wheel assembly is a cast wheel assembly with a single shroud connecting the blades, and said grouping is by slotting the shroud.

31. The method according the claim 16, wherein said grouping is by creating a plurality discontinuities in the wheel.

32. The method according to claim 16, wherein the wheel assembly includes a shroud connecting the blades, and said grouping including forming discontinuities in the shroud and the wheel.

33. The method according to claim 32, wherein the discontinuities are formed by slotting the shroud and the wheel.

34. A method for designing a cyclically symmetric device, comprising:

providing a cyclically symmetric device characterized by a plurality of harmonic families and a device capable of rotating in a range of rotational speeds, each of the harmonic families being characterized by an integral number of diametral node lines, each family including a plurality of natural frequencies, the cyclically symmetric device capable of vibrating at the natural frequencies;

determining an integral multiple of rotational speed that resonates one or more natural frequencies of a first harmonic family, the first harmonic family being characterized by a first integral number of diametral node lines, the first integral number being different than the integral multiple; and configuring the cyclically symmetric device such that the integral multiple of rotational speed does not resonate the one or more natural frequencies of the first harmonic family, the integral multiple of rotational speed resonating one or more natural frequencies of a second harmonic family, the second harmonic family being characterized by a second integral number of diametral node lines, the second integral number being different than the first integral number.

* * * * *

UNITED STATES PATENT AND TRADEMARK OFFICE
CERTIFICATE OF CORRECTION

PATENT NO.    : 6,542,859 B1
DATED         : April 1, 2003
INVENTOR(S)   : Burns et al.

It is certified that error appears in the above-identified patent and that said Letters Patent is hereby corrected as shown below:

Column 19,
Line 18, please change "ember" to -- member --.

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,542,859 B1
DATED : April 1, 2003
INVENTOR(S) : Donald W. Burns and John R. Louie It is certified that error appears in the above-identified patent and that said Letters Patent is hereby corrected as shown below:

<u>Column 4,</u>
Line 51, please change "patters" to -- patterns --.

<u>Column 7,</u>
Line 36, please change "5 EO" to -- 5EO --.

<u>Column 15,</u>
Line 18, please change "(M N1)" to -- (M≠N1) --.
Line 20, please change "(N 1)" to -- (N1) --.
Line 35, please change "(N2 ≦N1)" to -- (N2 < N1) --.
Line 54, please change "5 EO" to -- 5EO --.

Signed and Sealed this

Second Day of September, 2003

JAMES E. ROGAN
*Director of the United States Patent and Trademark Office*